(12) United States Patent
Kobayashi et al.

(10) Patent No.: US 10,069,251 B2
(45) Date of Patent: Sep. 4, 2018

(54) SWITCH CAP SUPPRESSING POWER CONSUMPTION OF SECONDARY BATTERY

(71) Applicants: Kabushiki Kaisha Toshiba, Minato-ku (JP); Toshiba Infrastructure Systems & Solutions Corporation, Saiwai-ku (JP)

(72) Inventors: Hiroyuki Kobayashi, Yokohama (JP); Takeshi Yasuda, Yokohama (JP); Hiroki Matsushita, Kawasaki (JP); Tomomi Kageyama, Shibuya (JP); Takaya Ogawa, Kawasaki (JP); Keitaro Hino, Ota (JP)

(73) Assignees: Kabushiki Kaisha Toshiba, Minato-ku (JP); Toshiba Infrastructure Systems & Solutions Corporation, Saiwai-ku (JP)

( * ) Notice: Subject to any disclaimer, the term of this patent is extended or adjusted under 35 U.S.C. 154(b) by 0 days.

(21) Appl. No.: 15/705,353

(22) Filed: Sep. 15, 2017

(65) Prior Publication Data

US 2018/0083393 A1 Mar. 22, 2018

(30) Foreign Application Priority Data

Sep. 16, 2016 (JP) ................................ 2016-181734
Jun. 1, 2017 (JP) ................................ 2017-109079

(51) Int. Cl.
*H01R 13/11* (2006.01)
*H01R 13/71* (2006.01)
(Continued)

(52) U.S. Cl.
CPC ............... *H01R 13/71* (2013.01); *H01H 9/54* (2013.01); *H01M 2/32* (2013.01);
(Continued)

(58) Field of Classification Search
CPC .......................... H01R 13/71; H01R 13/5219; H01R 13/5213; H01R 13/622; H02J 7/0029;
(Continued)

(56) References Cited

U.S. PATENT DOCUMENTS

| | | | |
|---|---|---|---|
| 7,649,341 B2 | 1/2010 | Kobuse et al. | |
| 9,692,240 B2* | 6/2017 | Brockman | ............ H02J 7/0029 |
| 9,908,490 B2* | 3/2018 | Saitou | ..................... B60R 16/03 |
| 2004/0189256 A1 | 9/2004 | Sink | |
| 2007/0273329 A1 | 11/2007 | Kobuse et al. | |

(Continued)

FOREIGN PATENT DOCUMENTS

| | | |
|---|---|---|
| EP | 1 450 174 A1 | 8/2004 |
| EP | 1 821 363 A1 | 8/2007 |

(Continued)

*Primary Examiner* — Jean F Duverne
(74) *Attorney, Agent, or Firm* — Oblon, McClelland, Maier & Neustadt, L.L.P.

(57) ABSTRACT

Certain embodiments provide a connector cover attached to a communication connector of a power supply device which includes a secondary battery and a manager. The connector cover includes a plurality of cover side terminals which are each connected to a plurality of connector side terminals, the connector side terminals are connection terminals included in the communication connector and provided on a supply circuit supplying power of the secondary battery to the manager and a cover base portion which has a first side on which the plurality of cover side terminals electrically connected by a conductive portion are positioned and a second side, and electrically connects between the plurality of connector side terminals on the supply circuit when the plurality of cover side terminals are connected to the connector side terminals and a protector which is positioned on the second side of the cover based portion.

20 Claims, 24 Drawing Sheets

(51) Int. Cl.
    *H01R 13/52*     (2006.01)
    *H01R 13/622*     (2006.01)
    *H01M 10/0525*     (2010.01)
    *H01M 10/42*     (2006.01)
    *H01M 2/32*     (2006.01)
    *H01H 9/54*     (2006.01)

(52) U.S. Cl.
CPC ..... *H01M 10/0525* (2013.01); *H01M 10/425* (2013.01); *H01R 13/5213* (2013.01); *H01R 13/5219* (2013.01); *H01R 13/622* (2013.01); *H01M 2010/4271* (2013.01); *H01M 2220/20* (2013.01)

(58) Field of Classification Search
CPC ........... B60R 16/03; H01H 9/54; H01M 2/32; H01M 10/0525; H01M 10/425; H01M 2010/4271

See application file for complete search history.

(56) References Cited

U.S. PATENT DOCUMENTS

| | | |
|---|---|---|
| 2015/0318725 A1 | 11/2015 | Brockman et al. |
| 2017/0133727 A1 | 5/2017 | Brockman et al. |

FOREIGN PATENT DOCUMENTS

| | | |
|---|---|---|
| JP | 2000-285968 | 10/2000 |
| JP | 3686776 | 8/2005 |
| JP | 2011-146261 | 7/2011 |
| JP | 2014-235915 | 12/2014 |

\* cited by examiner

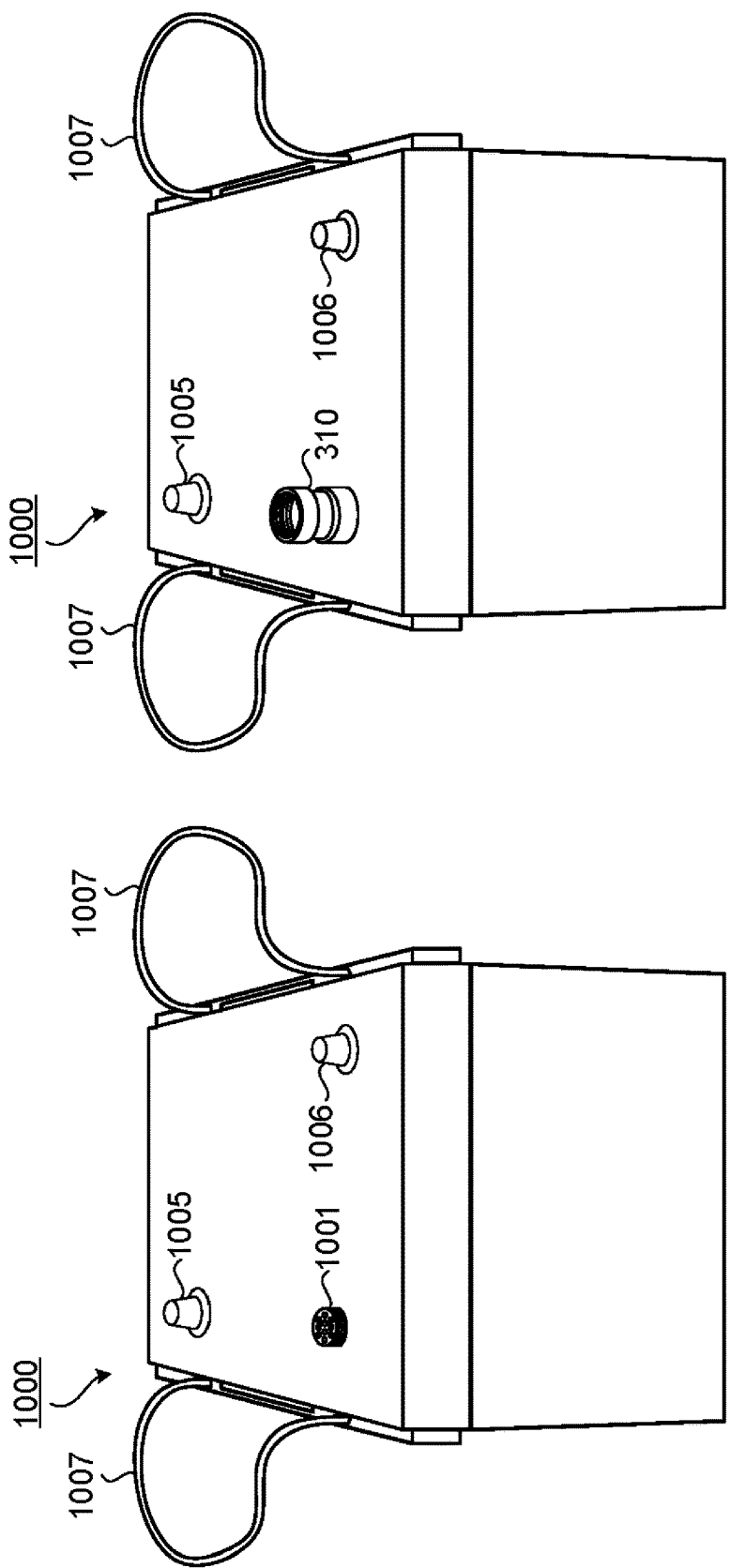

US 10,069,251 B2

SWITCH CAP SUPPRESSING POWER CONSUMPTION OF SECONDARY BATTERY

CROSS-REFERENCE TO RELATED APPLICATIONS

This application is based upon and claims the benefit of priority from the prior Japanese Patent Application No. 2016-181734, filed Sep. 16, 2016, and the prior Japanese Patent Application No. 2017-109079, filed Jun. 1, 2017, the entire contents all of which are hereby incorporated by reference.

FIELD

Embodiments described herein relate generally to a switch cap suppressing power consumption of a secondary battery.

BACKGROUND

A secondary battery device which includes a battery such as a lithium ion battery and a controller such as a battery management unit (BMU) managing the battery has been known. As an example of the battery management unit, there is a device which performs controller area network (CAN) communication with an engine controller as a host device, and the like, to transmit a voltage, a temperature, and the like of the battery to the host device.

In addition, the controller alone may sometimes operate to monitor and evaluate the battery without communicating with the host device. In this case, it is conceivable to attach a connector (dummy connector) starting the controller to a control connector of the secondary battery device to start the BMU.

While the dummy connector is attached (connected) to the control connector, the power of the battery is consumed by the operation of the controller. For this reason, if a user mistakes the dummy connector for a protective cap of the control connector and the dummy connector is left attached to the secondary battery device, the power of the battery is consumed against the user's intention.

BRIEF DESCRIPTION OF THE DRAWINGS

FIG. 27A is views illustrating an appearance of the secondary battery device according to the third and fourth embodiments.

FIG. 27B are views illustrating an appearance of the secondary battery device of the FIG. 27A to which the switch cap is attached.

DETAILED DESCRIPTION

A connector cover according to a certain embodiment is a connector cover attached to a communication connector of a power supply device which includes a secondary battery and a manager managing the secondary battery, the connector cover including: a plurality of cover side terminals which are each connected to a plurality of connector side terminals, the connector side terminals are connection terminals included in the communication connector and provided on a supply circuit supplying power of the secondary battery to the manager; a cover base portion which has a first side on which the plurality of cover side terminals electrically connected by a conductive portion are positioned and a second side different from the first side, and electrically connects between the plurality of connector side terminals on the supply circuit when the plurality of cover side terminals are connected to the connector side terminals; and a protector which is positioned on the second side of the cover based portion.

Hereinafter, the present embodiment will be described in detail with reference to the drawings.

First Embodiment

Figure 1:
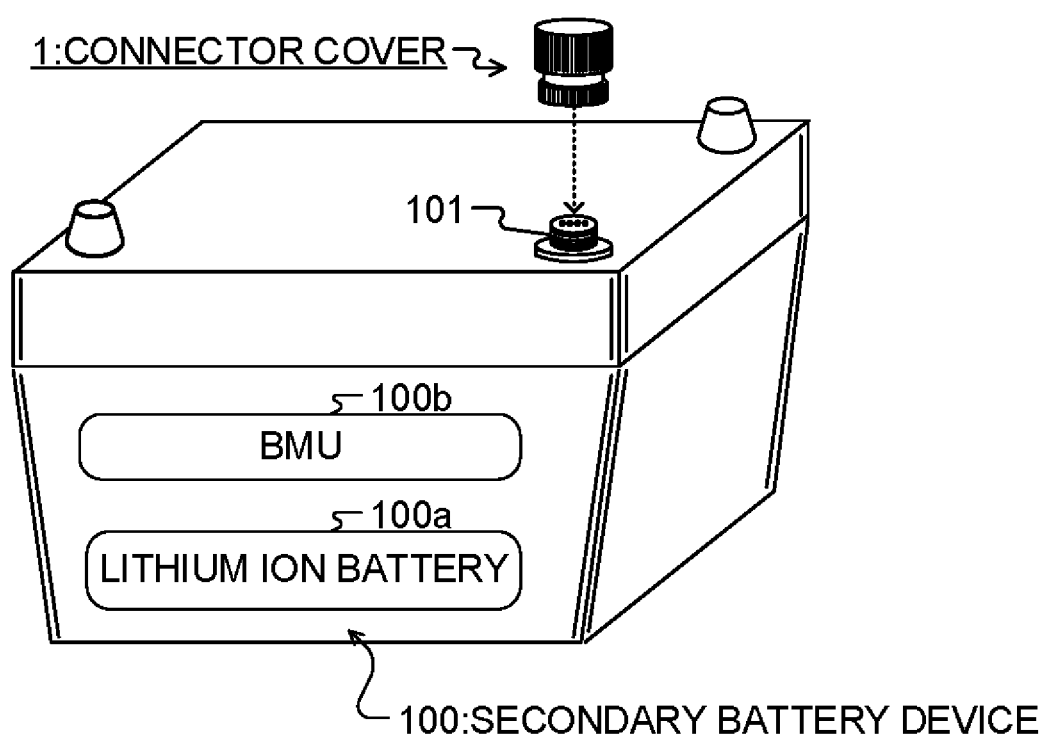
FIG. 1 is a schematic view illustrating an appearance of a secondary battery device to which a connector cover according to a first embodiment is attached.

Referring to FIG. 1, a secondary battery device 100, also referred to as a power supply device, of the first embodiment includes a lithium ion battery 100a used as a vehicle battery and a battery management unit (BMU) 100b. The BMU 100b is a controller, also referred to as a management unit, which monitors a voltage or a temperature of the lithium ion battery 100a and protects (controls) the lithium ion battery 100a based on the monitored data. For convenience of explanation, in the first embodiment, a case where the number of lithium ion batteries 100a is one will be described, but the number or a connection mode (parallel or serial) of lithium ion batteries 100a can be appropriately changed.

A connector cover 1, also referred to as a switch cap, is attached to a control connector 101. For example, the control connector 101 is configured of a controller area network (CAN) communication connector, or the like. The connector cover 1 may be used when the BMU 100b alone monitors and evaluates the lithium ion battery 100a without using a host device (when the BMU 100b starts with power of the lithium ion battery 100a).

Figure 2:
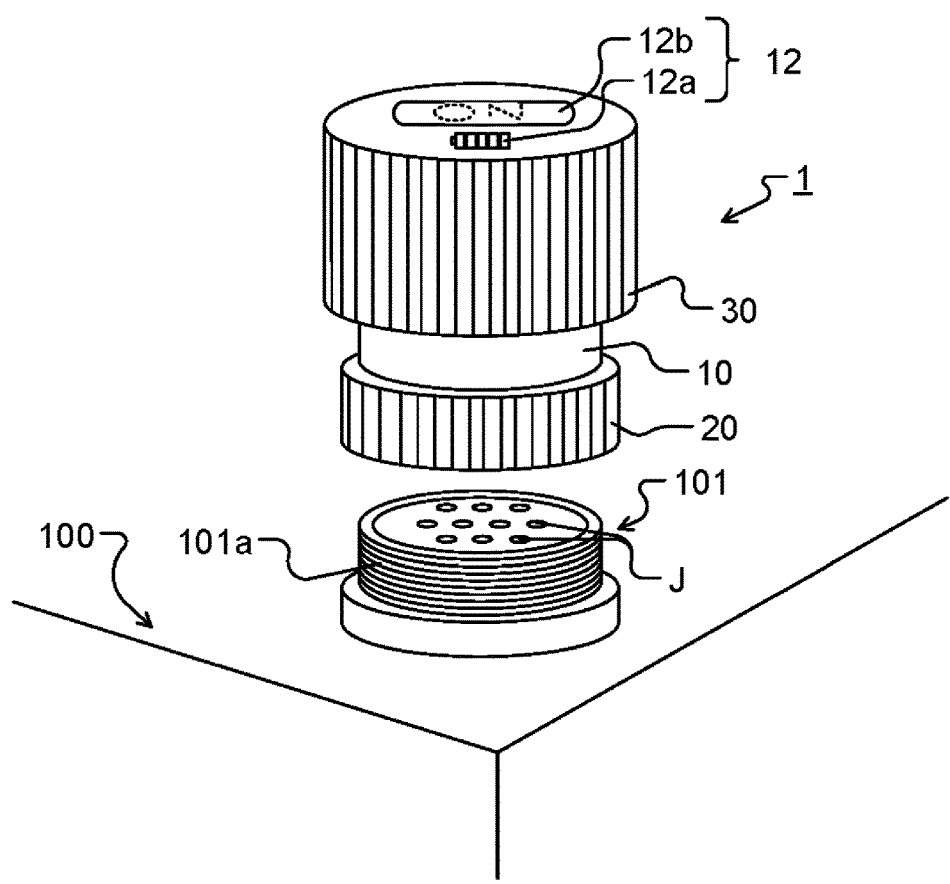
FIG. 2 is a view illustrating a connector cover before the connector cover is attached to the secondary battery device.

As illustrated in FIG. 2, the connector cover 1 is attached to the control connector 101 so that the control connector 101 is covered from above and protects the control connector 101 from the outside. In addition, the connector cover 1 has a battery state display 12 provided on an upper surface thereof, with a side where the connector cover 1 is attached to the control connector 101 at the time of starting the BMU 100b as a downward direction, in which the battery state display 12 displays information regarding a state of the lithium ion battery 101a. Hereinafter, in attaching the connector cover 1 to the control connector 101 to start the BMU 100b with the power of the lithium ion battery 100a, the control connector 101 side of the connector cover 1 is referred to as a lower side (or starting side) and an opposite side to the starting side is referred to as an upper side (or non-starting side).

Figure 3:
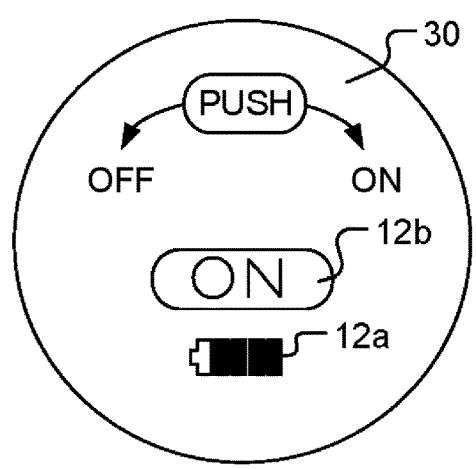
FIG. 3 is a top view of the connector cover attached to the secondary battery device.

The battery state display 12 includes a battery residual quantity display 12a and a connection state display 12b. For example, as illustrated in FIG. 3, the battery residual quantity display 12a displays a state of charge (SOC) of the lithium ion battery 100a.

The connection state display 12b displays the connection state of the lithium ion battery 100a The connection state displayed by the connection state display 12b will be described later.

Referring back to FIG. 2, the connector cover 1 includes a housing portion 10, a disengagement preventing portion 20, and an operating portion 30.

Figure 4A:
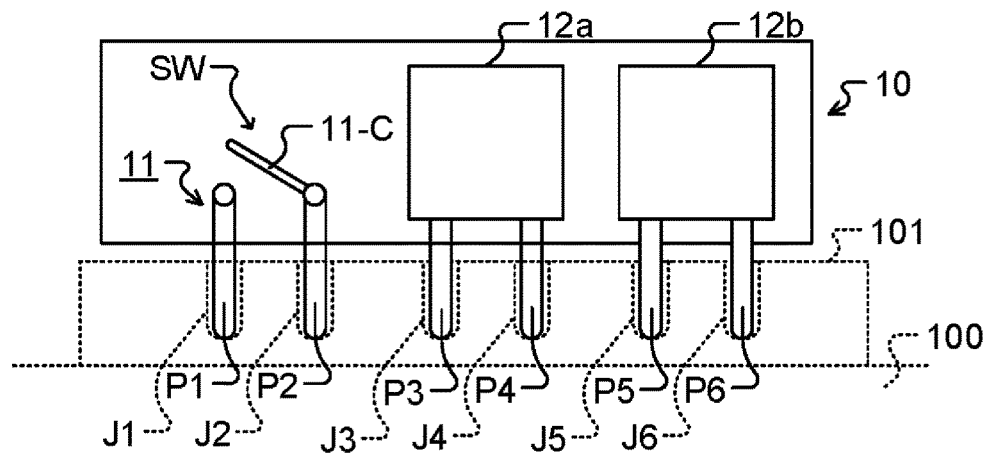
FIG. 4A is a view illustrating an inside of the connector cover (switch off state) attached to the secondary battery device.
Figure 4B:
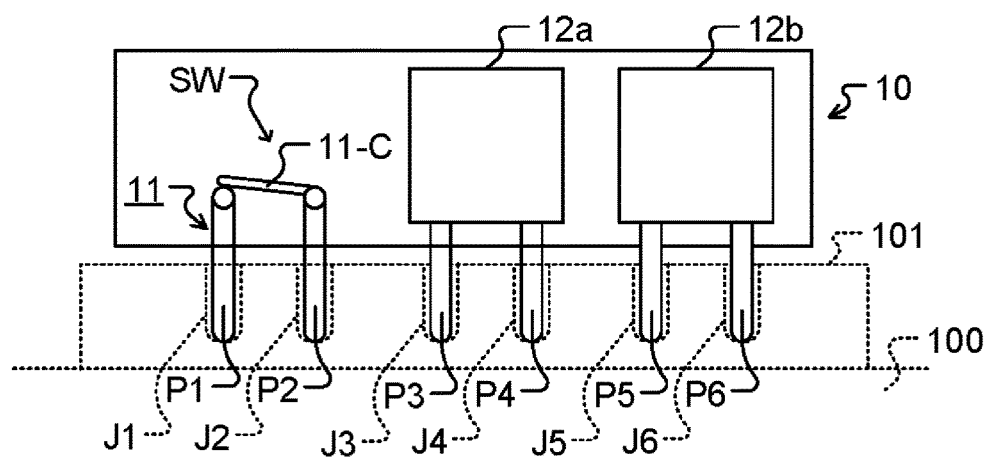
FIG. 4B is a view illustrating the inside of the connector cover (switch on state) attached to the secondary battery device.

As illustrated in FIGS. 4A and 4B, the housing portion 10 includes a pin terminal portion 11, the battery residual quantity display 12a, and the connection state display 12b. In addition, the housing portion 10 includes at least six pin plugs P1 to P6 which are provided on a surface (also referred to as a surface of the starting side) opposite to the control connector 101 when the BMU 100b starts. The pin terminal portion 11, the battery residual quantity display 12a, and the connection state display 12b each have a pair of pin plugs among the six pin plugs P1 to P6. Specifically, the pin terminal portion 11 includes the pin plug P1 and the pin plug P2, the battery residual quantity display 12a includes the pin plug P3 and the pin plug P4, and the connection state display 12b includes the pin plug P5 and the pin plug P6, respectively. Hereinafter, unless each pin plug is distinguished, the pin plugs are collectively referred to as a pin plug P (or connector side terminal). In addition, the housing portion 10 is referred to as a base portion of the connector cover 1 (or switch cap).

Each pin plug P of the pin terminal portion 11, the battery residual quantity display 12a, and the connection state display 12b is a contact pin made of an electrical conductor such as copper, aluminum, and iron. The pin plug P has a free end exposed outside (downward) of the housing portion 10. In addition, parts other than the pin plug P of the pin terminal portion 11, the battery residual quantity display 12a, and the connection state display 12b are hermetically housed in the housing portion 10.

The pin terminal portion 11 includes the pin plug P1, the pin plug P2 and a switch SW. The pin plug P1 and the pin plug P2 are inserted into a jack terminal J1 and a jack terminal J2 of the control connector 101.

It should be noted that an axis which passes through a center of the connector cover 1 and has a straight line, along which the connector cover 1 is attached to the control connector 101 (pin plug P extends), passing therethrough is referred to as an axis center of the connector cover 1. The same applies hereinafter. Here, all of the plurality of pin plugs P of the housing portion 10 are disposed on the side to which the control connector 101 is attached, and extend in the same direction along the axis center (direction in which the connector cover 1 is attached to the control connector 101).

Figure 5:
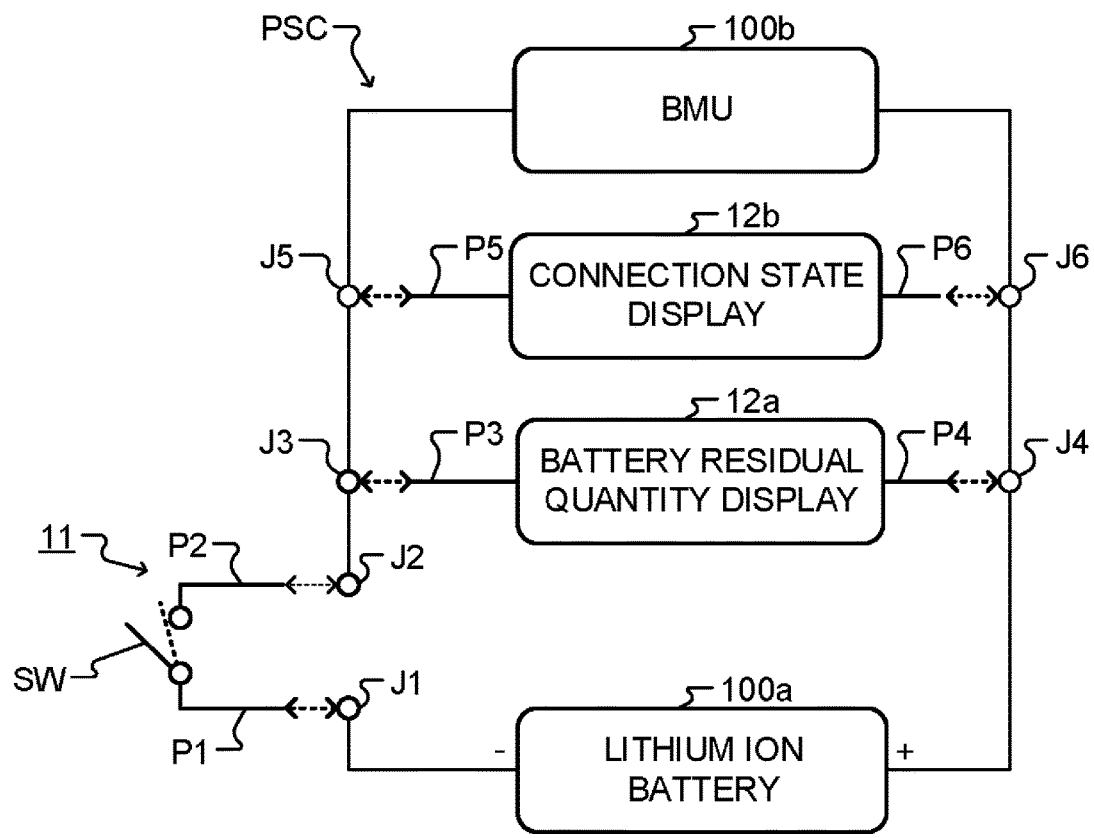
FIG. 5 is a view illustrating a circuit configuration of the connector cover and the secondary battery device.

As illustrated in FIG. 5, the jack terminal J1 and the jack terminal J2 are electrically disposed between the lithium ion battery 100a and the BMU 100b. Specifically, as illustrated in FIG. 5, the jack terminal J1 and the jack terminal J2 corresponding to the pin plugs P1 and P2 of the pin terminal portion 11 are disposed between the lithium battery and the BMU 100b provided on a distribution circuit (power supply circuit PSC) that supplies the power of the lithium ion battery 100a to the BMU 100b.

Figure 6A:
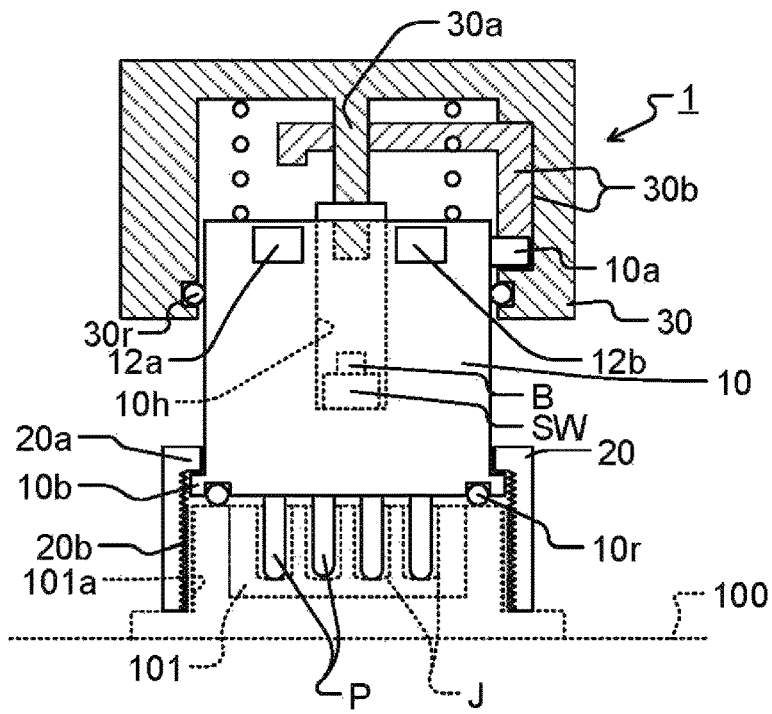
FIG. 6A is a view illustrating an internal state of the connector cover at the time of non-pressing.
Figure 6B:
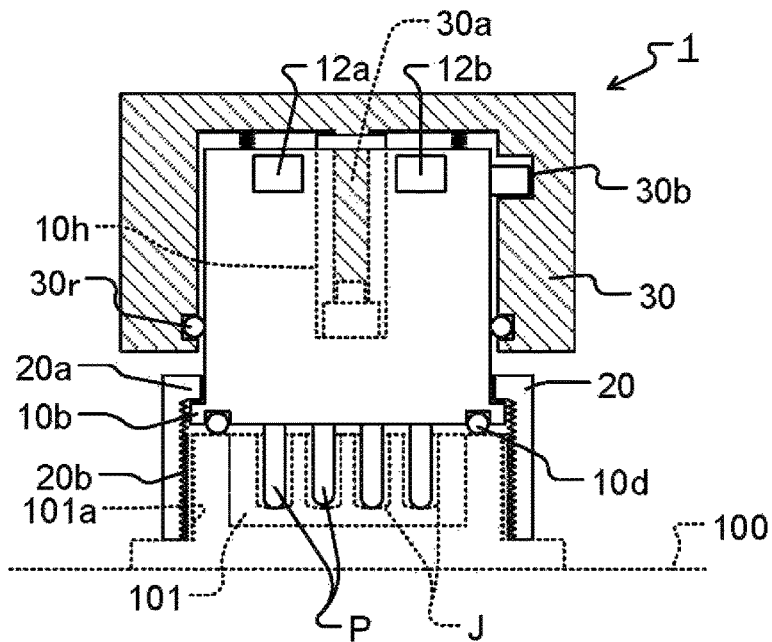
FIG. 6B is a view illustrating the internal state of the connector cover at the time of pressing.

As illustrated in FIGS. 4A and 4B, the switch SW includes, for example, a conductive portion 11-C which short-circuits (electrically connects) between the pin plug P1 and the pin plug P2 in the on state and a rotary switch which opens and closes a contact between the pin plug P1 and the pin plug P2 in accordance with the operation of the operating portion 30. As illustrated in FIGS. 6A and 6B, the switch SW switches the opening and closing (on and off) of the electrical connection between the pin plug P1 and the pin plug P2 illustrated in FIG. 5 by rotating a bearing B provided thereon by a predetermined amount. Since the bearing B is engaged with the operating portion 30, it is rotated according to the operation of the operating portion 30. The jack terminal J1 and the jack terminal J2 are conducted to each other when the contact between the pin plug P1 and the pin plug P2 is closed (that is, when the switch SW is in the on state).

That is, when the pin plug P1 and the pin plug P2 are inserted into the jack terminal J1 and the jack terminal J2, and when the switch SW is in the ON state, the conductive portion of the switch SW electrically connects between the jack terminal J1 and the jack terminal J2. At this time, the power of the lithium ion battery 100a is supplied to the BMU 100b to start the BMU 100b. In contrast, even when the pin plug P1 and the pin plug P2 are inserted into the corresponding jack terminal J1 and jack terminal J2, if the switch SW is in an off state, the jack terminal J1 and the jack terminal J2 are electrically insulated from each other, and the power of the lithium ion battery 100a is not supplied to the BMU 100b.

In addition, as illustrated in FIGS. 6A and 6B, in the housing portion 10, a waterproof ring 10r is provided at a part which is engaged with the control connector 101. The waterproof ring 10r is formed of an O ring, or the like which is made of, for example, rubber and silicone. The waterproof ring 10r prevents a gap of the part engaged with the control connector 101 from being generated to waterproof a region where the control connector 101 and the switch cap 1 are engaged with each other, including the part where the pin plug P1 and the pin plug P2 are connected to the jack terminal J1 and the jack terminal J2.

Referring back to FIG. 5, if the jack terminal J1 and the jack terminal J2 are conducted to each other by the switch SW of the pin terminal portion 11, the BMU 100b starts by power supplied from the lithium ion battery 100a. The BMU 100b monitors and evaluates the voltage, the temperature, or the like of the lithium ion battery 100a and sequentially stores the results. In this way, the BUM 100b serves as a management device which manages the lithium ion battery 100a which is the secondary battery.

The battery residual quantity display 12a is configured of a voltage measurer which includes a battery residual quantity meter integrated circuit (IC) which includes a voltage sensor and a circuit processing a measured value and display devices such as a light emitting diode (LED) and a liquid crystal display which displays the obtained SOC. The battery residual quantity display 12a is disposed on an upper surface of the housing portion 10. The pin plugs P3 and P4 of both ends of the battery residual quantity display 12a are inserted into the jack terminals J3 and J4 as soon as the pin plugs P1 and P2 of the pin terminal portion 11 are inserted into the jack terminals J1 and J2.

The jack terminal J3 and the jack terminal J4 are connected in parallel to a supply circuit that supplies the power of the lithium ion battery 100a to the BMU 100b. The battery residual quantity display 12a is connected to the jack terminal J3 and the jack terminal J4, and estimates the SOC using a voltage measurement method for obtaining an SOC from a voltage drop of a terminal voltage of the jack terminals J3 and J4. The estimated SOC is displayed using the liquid crystal or the LED. The method of obtaining a battery residual quantity by the battery residual quantity display 12a is not limited thereto, but other known methods may be used instead. For example, the battery residual quantity display 12a may acquire the information of the SOC from the BMU 100b which obtains the SOC of the lithium ion battery 100a by coulomb counting processing, and display the acquired information.

In the state in which the switch SW is in the switch off state, the battery residual quantity display 12a is not displayed (turned off) even when the pin plug P3 and the pin plug P4 are inserted into the jack terminal J3 and the jack terminal J4. In contrast, if the switch SW is closed (in the on state) in the state in which the pin plugs P3 and P4 are inserted into the jack terminals J3 and J4, the battery residual quantity display 12a measures the voltage of the lithium ion battery 100a. The SOC is estimated based on the measured voltage, and as illustrated in FIG. 3, the residual quantity of the lithium ion battery 100a is displayed.

The connection state display 12b is configured of the display devices such as the LED and the liquid crystal. The connection state display 12b is disposed on the upper surface of the housing portion 10. The connection state display 12b includes a plurality of LEDs which are arranged in, for example, a form of character "ON". The pin plug P5 and the pin plug P6 of both ends of the connection state display 12b are inserted into the jack terminal J5 and the jack terminal J6 as soon as the pin plug P1 and the pin plug P2 of the pin terminal portion 11 are inserted into the jack terminal J1 and the jack terminal J2.

The jack terminal J5 and the jack terminal J6 are disposed in parallel to the lithium ion battery 100a and the BMU 100b. The connection state display 12b is electrically connected to the jack terminal J5 and the jack terminal J6. In the state in which the pin plug P5 and the pin plug P6 are inserted into the jack terminal J5 and the jack terminal J6, respectively, when the switch SW of the pin terminal portion 11 is open, the arranged character 'ON' of the connection state display 12b is not displayed (turned off). In contrast, if the switch SW is closed in the state in which the pin plug P5 and the pin plug P6 are inserted into the jack terminal J5 and the jack terminal J6, the connection state display 12b lights the character 'ON' by the current supplied from the lithium ion battery 100a.

As an example, as illustrated in FIG. 5, the jack terminal J1 is connected to a positive electrode of the lithium ion battery 100a. The BMU 100b has two input terminals, one terminal of which is connected to a negative electrode of the lithium ion battery 100a, the jack terminal J4, and the jack terminal J6. One terminal of the BMU 100b is connected to the jack terminal J2, the jack terminal J3, and the jack terminal J5. The jack terminal J2 and the jack terminal J1 are not electrically connected when the connector cover 1 is not attached. The positive electrode and the negative electrode of the lithium ion battery 100a may be reversed. The same applies hereinafter. Unless the jack terminal J1 to the jack terminal J6 are not distinguished, they are merely referred to as a jack terminal J or a connector side terminal.

For example, as illustrated in FIGS. 6A and 6B, the disengagement preventing portion 20 is formed of a cylindrical member of which both ends are open. The disengagement preventing portion 20 is movably provided in an axial direction and a circumferential direction along an outer circumferential surface of the housing portion 10. In addition, the disengagement preventing portion 20 is provided with an engaging portion 20a which is engaged with a stepped portion 10b extending from the outer circumferential surface at the lower end of the housing portion 10. The housing portion 10 is prevented from disengaging from the disengagement preventing portion 20 by the engaging portion 20a.

In addition, the disengagement preventing portion 20 provided in an attachable and detachable manner to the control connector 101. An inside of a cylinder of the disengagement preventing portion 20 is provided with a female screw 20b. The female screw 20b is screwed with a male screw 101a formed on the outer circumference of the control connector 101 and thus prevented from disengaging from the control connector 101. In the disengagement preventing portion 20, the engaging portion 20a is engaged with the stepped portion 10b and thus is prevented from disengaging from the housing portion 10, and the female screw 20b is screwed with the male screw 101a and thus is prevented from disengaging from the control connector 101. By preventing the disengagement preventing portion 20 from disengaging from both of the housing portion 10 and the control connector 101, the whole of the connector cover 1 including the housing portion 10 is prevented from disengaging from the control connector 101.

For example, the operating portion 30 is, for example, a cylindrical member whose lower end is open and upper end is closed. The operating portion 30 configures a knob portion which is manually operated by pressing and rotation by a user. As described below, if the operating portion 30 is pressed, the operating portion 30 can be rotated around the axis center. In addition, the operating portion 30 is rotated around the axis center by a predetermined angle, such that the on state and the off state of the switch SW are switched. The operating portion 30 is urged upward (in a direction opposite to the insertion direction of the pin plug P) by an elastic member such as a spring provided on the upper outer side of the housing portion 10. By the urging force, the operating portion 30 is supported at a normal position (a position at the time of non-pressing and a position of FIG. 6A). In addition, after the pressing operation is performed by the user, the operating portion 30 returns to the normal position by the urging force.

In addition, a shaft 30a is formed downward from an inner center of the operating portion 30. The shaft 30a is inserted into an axial hole 10h provided on an upper center of the housing portion 10. If the operating portion 30 is pressed or subjected to an urging force because of not being subjected to a pressing operation, the shaft 30a vertically moves in an axial direction in the axial hole 10h. In addition, a tip of the shaft 30a is engaged with the bearing B of the switch SW that is coaxially provided with the shaft 30a in the axial hole 10h. For this reason, the shaft 30a rotates the bearing B in accordance with the rotation of the operating portion 30.

In addition, a guide groove 30b which is an elongated depression is formed on an inner circumferential surface of the operating portion 30. The guide groove 30b is engaged with the guide piece 10a protruding from the outer side of the housing portion 10. The engagement and rotation of the bearing B of the switch SW by the shaft 30a are guided by the guide piece 10a and the guide groove 30b.

Figure 7A:
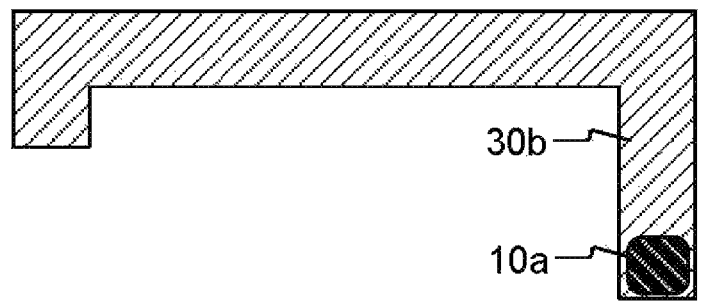
FIG. 7A is a view illustrating a position of a guide piece in a guide groove in the switch off state.
Figure 7B:
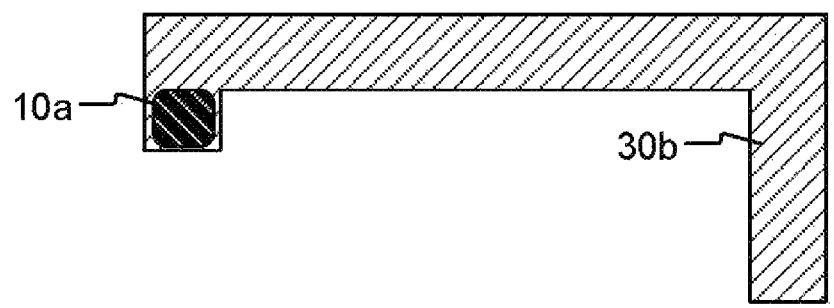
FIG. 7B is a view illustrating the position of the guide piece in the switch on state.

As illustrated in FIGS. 7A and 7B, for example, the guide groove 30b is continuously formed in an L shape. In FIGS. 7A and 7B, parts depressed relative to other regions on the inner circumferential surface of the operating portion 30 are indicated by oblique lines. When the shaft 30a is at the position illustrated in FIG. 6A, the guide piece 10a is at the position of the guide groove 30b illustrated in FIG. 7A. In contrast, if the user presses the operating portion 30 against the urging force of the elastic member supporting the operating portion 30, the guide piece 10a moves to the position of a lateral side of the guide groove 30b and the operating portion 30 can rotatably move. In this state, if the operating portion 30 is rotated by an angle corresponding to a length of the lateral side of the guide groove 30b, the rotation of the operating portion 30 is transmitted to the bearing B via the shaft 30a. The switch SW is switched from the off state to the on state. If the user stops pressing, the shaft 30a moves to the position illustrated in FIG. 6B. In this case, the guide piece 10a moves to the position of the guide groove 30b illustrated in FIG. 7B.

If the guide piece 10a is subjected to the pressing operation when it is at the position of FIG. 7B, the guide piece 10a moves to the position of the lateral side of the guide groove 30b, and the operating portion 30 can rotatably move again. At this time, if the operating portion 30 is rotated, the operating portion returns to the position of FIG. 7A. At this time, the bearing B is rotated and the switch SW is switched from the on state to the off state.

In addition, the position where the operating portion 30 is engaged with the housing portion 10 is provided with the waterproof ring 30r which prevents a gap between the operating portion 30 and the outer circumferential surface of the housing portion 10 from occurring. The waterproof ring 30r is formed of an O ring, or the like which is made of, for example, rubber or silicone. The waterproof ring 30r waterproofs a moving space of the housing portion 10 on the inner side of the operating portion 30.

In addition, as illustrated in FIG. 3, information for guiding the operation of the connector cover 1 is printed on the upper surface of the operating portion 30. For example, it is printed that if the connector cover 1 is pressed and rotated to the right, the switch is in an on state and if the connector cover 1 is pressed and rotated to the left, the switch is in the off state. In this way, according to the structure of the connector cover 1 including the guide groove 30b and the switch SW, information corresponding to how the switch SW is switched to the on state and the off state by the operation of the operating portion 30 is displayed on the operating portion 30. The user performs a manual operation of two actions of the pressing and rotation according to the information. As a modified example, the switch SW and the operating portion 30 may be configured so that the switch SW is in the on state at the position of FIGS. 6A and 7A and in the on state of FIGS. 6B and 7B. In this case, the meaning that if the connector cover 1 is rotated to the left, the switch is in the on state and if the connector cover 1 is rotated to the right, the switch is in the off state is printed on the upper surface of the operating portion 30.

In addition, it is preferable that at least the part of the operating portion 30 corresponding to the quantity display 12a and the connection state display 12b is made of a transparent material so that the user can visually recognize the battery residual quantity display 12a and the connection state display 12b which are disposed on the upper surface of the housing portion 10.

If the connector cover 1 configured as described above is used, the user first covers the disengagement preventing portion 20 from above the control connector 101. The user rotates the disengagement preventing portion 20, such that the female screw 20b of the disengagement preventing portion 20 is screwed with the male screw 101a of the control connector 101. By doing so, as illustrated in FIG.

6A, each pin plug P is inserted into the jack terminal J. Specifically, the pin plug P1 and the pin plug P2 of the pin terminal portion 11 are inserted into the jack terminal J1 and the jack terminal J2. The pin plug P3 and the pin plug P4 of the battery residual quantity display 12a are inserted into the jack terminal J3 and the jack terminal J4. The pin plug P5 and the pin plug P6 of the connection state display 12b are inserted into the jack terminal J5 and the jack terminal J6. In this case, the switch SW of the pin terminal portion 11 is in the open state (off state).

Next, if the user presses the operating portion 30 and rotates the operating portion 30 to the right, as illustrated in FIG. 6B, the shaft 30a is engaged with the bearing B and at the same time the bearing B is rotated. By doing so, the switch SW is in the closed state (on state), and the jack terminal J1 and the jack terminal J2 are electrically conducted to each other. In this case, the BMU 100b starts by the power supplied from the lithium ion battery 100a. The BMU 100b monitors and evaluates the voltage, the temperature, or the like of the lithium ion battery 100a and sequentially stores the results.

Further, in this case, the battery residual quantity display 12a displays the state of charge (SOC) of the lithium ion battery 100a. Further, the connection state display 12b lights the character "ON" arranged by the plurality of LEDs.

If the use of the connector cover 1 is terminated, the user performs the reverse operation to the above to remove the connector cover 1 from the control connector 101.

As described above, the connector cover 1 according to the first embodiment can switch the start and stop of the BMU 100b by the manual operation of the two actions of the pressing and rotation. Further, the information regarding the state of the lithium ion battery 100a can be displayed on the battery state display 12 (battery residual quantity display 12a, connection state display 12b). By doing so, the user can know the state of charge and the connection state of the lithium ion battery 100a. In addition, the user may simply confirm whether or not the BMU 100b is operating based on the display of the battery residual quantity display 12a or the connection state display 12b. For this reason, it is possible to suppress the power consumption of the lithium ion battery 100a against the user's intention, such as forgetting to take out the connector cover 1.

In addition, the portion of the housing portion 10 of the connector cover 1 which is engaged with the control connector 101 is provided with the waterproof ring 10r, such that it is possible to waterproof the control connector 101. In addition, the operating portion 30 of the connector cover 1 is provided with the waterproof ring 30r which prevents the gap between the operating portion 30 and the outer circumferential surface of the housing portion 10 from occurring, such that it is possible to waterproof the moving space of the housing portion 10 in the inner side of the operation portion 30.

The control connector 101 of the first embodiment has an attaching surface which is a substantially circular flat surface from which the plurality of jack terminals J are exposed. The plurality of jack terminals J are provided with the jack terminal J1 and the jack terminal J2 which are disposed in a power supply circuit PSC supplying the power of the lithium ion battery 100a to the BMU 100b. The connector cover 1 includes the pin plug P1 which is inserted into (connected to) the jack terminal J1 and the pin plug P2 which is inserted into the jack terminal J2. In addition, if the switch SW is turned ON when the pin plug P1 and the pin plug P2 are connected to the corresponding jack terminals J, the conductive portion of the switch SW conducts the jack terminal J1 and the jack terminal J2. For this reason, the power supply circuit PSC which supplies the power of the lithium ion battery 100a to the BMU 100b is short-circuited, and the BMU 100b starts.

Figure 8:
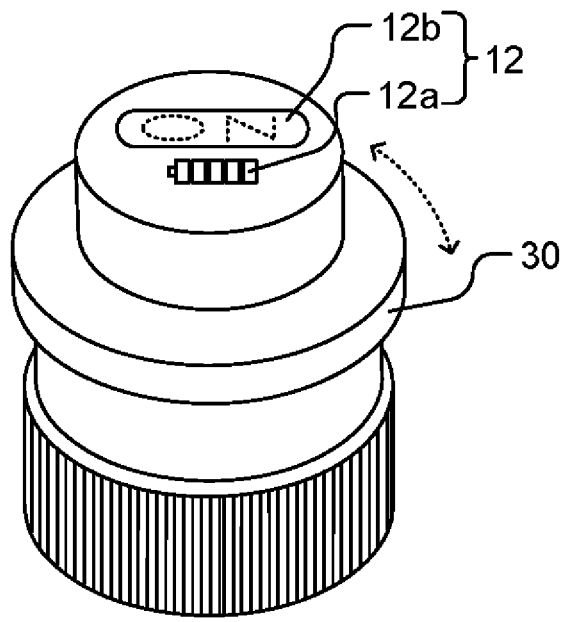
FIG. 8 is a view illustrating a connector cover according to a first modified example of the first embodiment.
Figure 9:
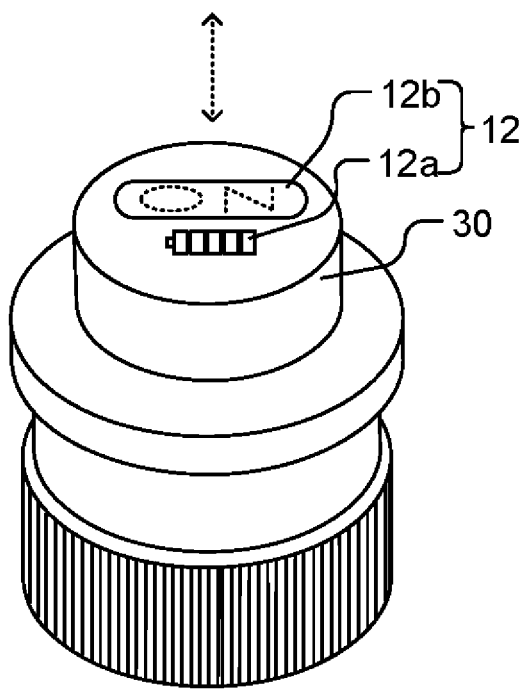
FIG. 9 is a view illustrating a connector cover according to a second modified example of the first embodiment.

It should be noted that the operation of the operating portion 30 for opening and closing the switch SW in the connector cover 1 is not limited to that described in the above embodiment. For example, as illustrated in FIG. 8, the operating portion 30 is subjected to the rotation operation, and the switch SW may be configured so that the contact between the pin plug P1 and the pin plug P2 of the pin terminal portion 11 is open and closed (electrical connection is on/off) by the rotation operation. Alternatively, as illustrated in FIG. 9, the operating portion 30 is subjected to the pressing operation, and the switch SW may be configured so that the electrical connection between the pin plug P1 and the pin plug P2 is on/off based on the pressing operation.

Figure 10:
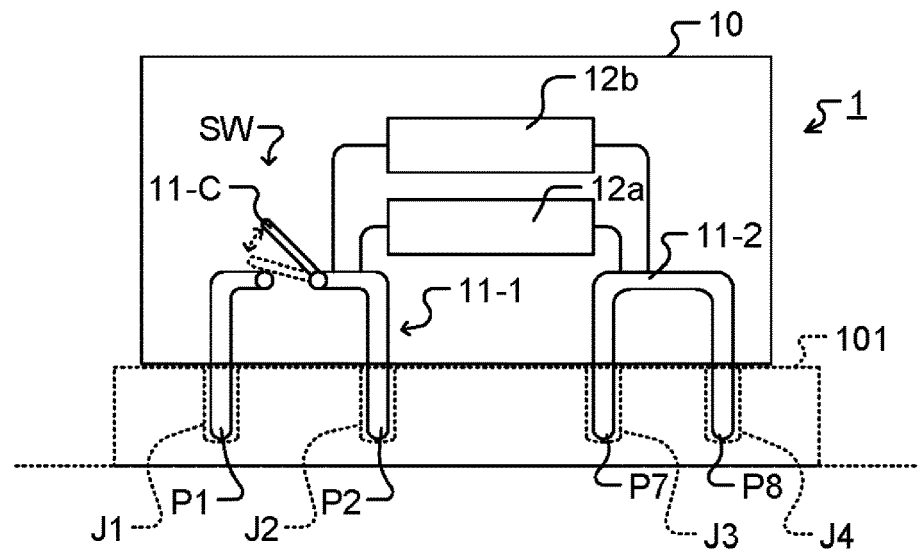
FIG. 10 is a view illustrating a connection configuration of a connector cover according to a third modified example of the first embodiment.
Figure 11:
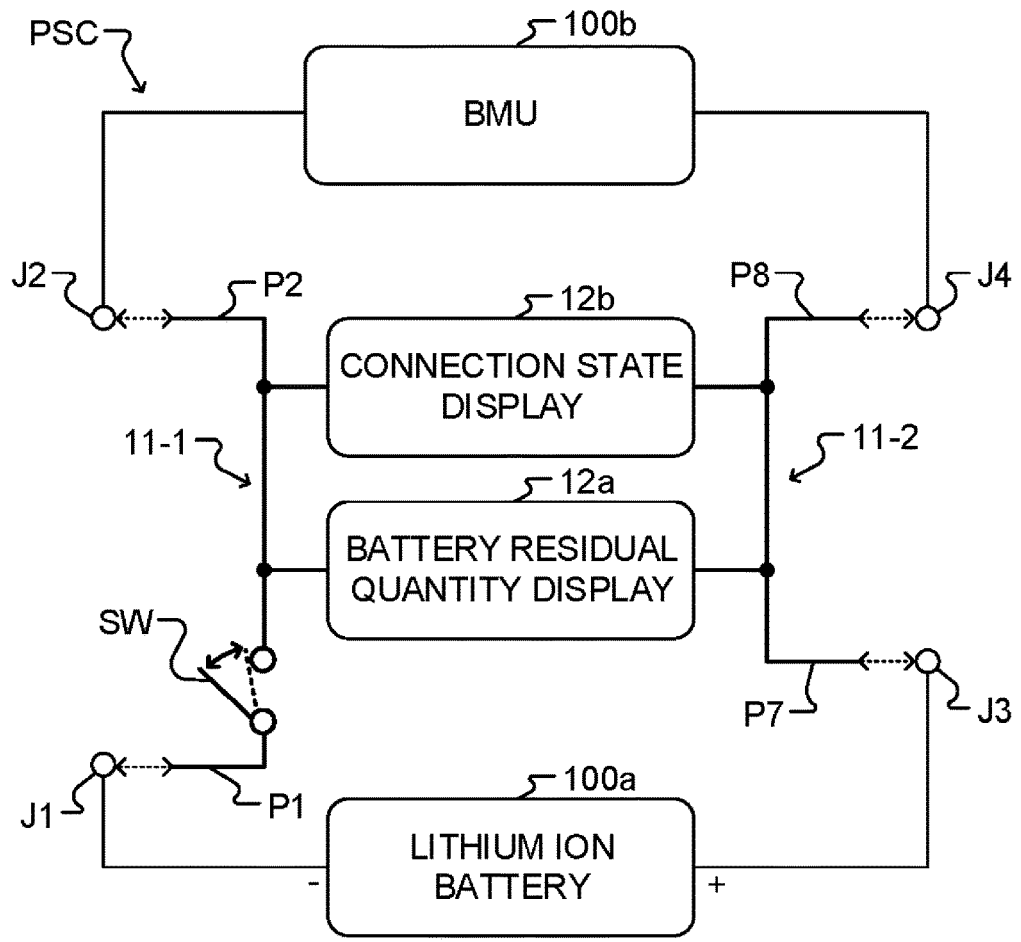
FIG. 11 is a view illustrating a circuit configuration of the connector cover illustrated in FIG. 10 and the secondary battery device.

In addition, the housing portion 10 may be configured to include a pair of pin terminal portion 11-1 and pin terminal portion 11-2, the battery residual quantity display 12a, and the connection state display 12b (see FIGS. 10 and 11). The pin terminal portion 11-1 is provided with the pin plug P1 and the pin plug P2 at a left end of FIG. 10. The pin plug P1 and the pin plug P2 of the pin terminal portion 11-1 are inserted into the jack terminal J1 and the jack terminal J2 of the control connector 101. In contrast, the pin terminal portion 11-2 is provided with a pin plug P7 and a pin plug P8 at a right end of FIG. 10. The pin plug P7 and the pin plug P8 of the pin terminal portion 11-2 are inserted into the jack terminal J3 and the jack terminal J4 of the control connector 101. In the modified example, the battery residual quantity display 12a and the connection state display 12b are connected in parallel to the pin terminal portion 11-1 and the pin terminal portion 11-2. Here, the battery residual quantity display 12a and the connection state display 12b is connected to the pin plug P2 and pin plug P7.

As illustrated in FIGS. 10 and 11, even in the modified example, by opening and closing the switch SW provided between the pin plug P1 and the pin plug P2 of the pin terminal portion 11-1, the non-conduction and the conduction between the jack terminal J1 and the jack terminal J2 may be switched. In the configuration of the modified example, even if the battery residual quantity display 12a and the connection state display 12b are provided, there is no need to separately provide the pin plugs P corresponding to each of the battery residual quantity display 12a and the connection state display 12b.

Second Embodiment

In the second embodiment, a description will be given of the connector cover 1 for switching the opening and closing of the switch SW in response to a contactless operation by a user within a certain range from a position of the connector cover 1. It should be noted that the same components as those described in the first embodiment are denoted by the same reference numerals and the duplicate description thereof will be omitted.

Figure 12:
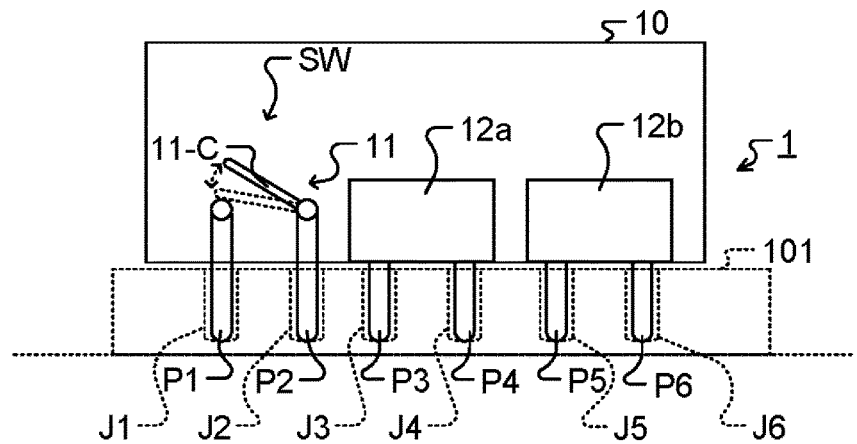
FIG. 12 is a view illustrating a configuration of a connector cover according to a second embodiment.

As illustrated in FIG. 12, the housing portion 10 includes a pin terminal portion 11, a battery residual quantity display 12a, and a connection state display 12b. Each pin plug P is inserted into jack terminals J of a control connector 101 each corresponding thereto. The pin terminal portion 11 includes a switch SW which switches opening and closing by the contactless operation. The switch SW is hermetically housed inside the housing portion 10.

Figure 13:
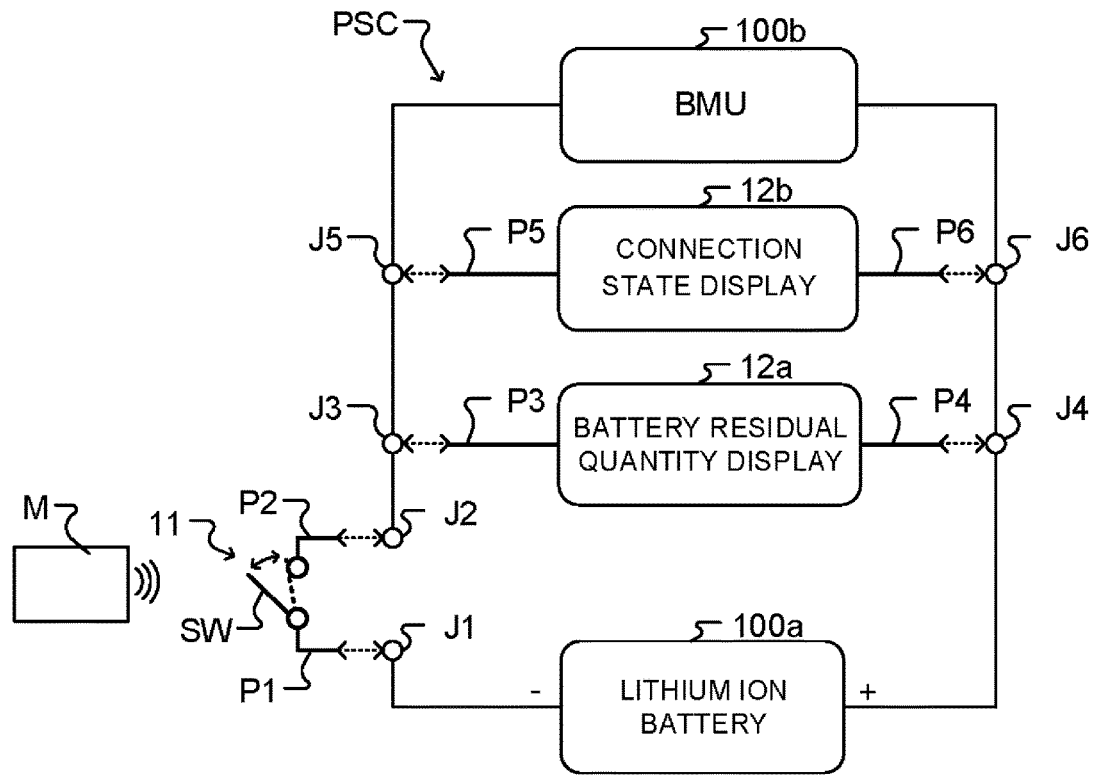
FIG. 13 is a view illustrating a circuit configuration of the connector cover illustrated in FIG. 12 and the secondary battery device.

The switch SW is, for example, a magnet switch, or the like. Specifically, the switch SW is configured to be remotely operated by a magnet M as illustrated in FIG. 13. Specifically, if an N pole side of the magnet M approaches the switch SW, a gap between the pin plug P1 and the pin plug P2 becomes an on state (the contact is closed). In contrast, if the switch SW approaches an S pole side of the magnet M, the switch SW is configured so that the gap between the pin plug P1 and the pin plug P2 is in an OFF state (the contact is open).

If the switch SW is in the closed state (on state), the jack terminal J1 and the jack terminal J2 are electrically conducted to each other, and the BMU 100b starts by power supplied from the lithium ion battery 100a. At this time, the battery residual quantity display 12a displays a state of charge of the lithium ion battery 100a as illustrated in FIG. 3. In addition, at this time, the connection state display 12b lights character 'ON' by a current supplied from the lithium ion battery 100a.

In contrast, if the switch SW is in the open state (OFF state), the jack terminal J1 and the jack terminal J2 are non-conducted from each other and the BMU 100b stops. At this time, both the battery residual quantity display 12a and the connection state display 12b are in a non-display (turned-off) state.

As described above, according to the connector cover 1 according to the second embodiment, it is possible to switch the opening and closing of the waterproof switch SW inside the housing portion 10 by the non-contact operation. That is, it is possible to improve the operability of the connector cover 1.

Figure 14:
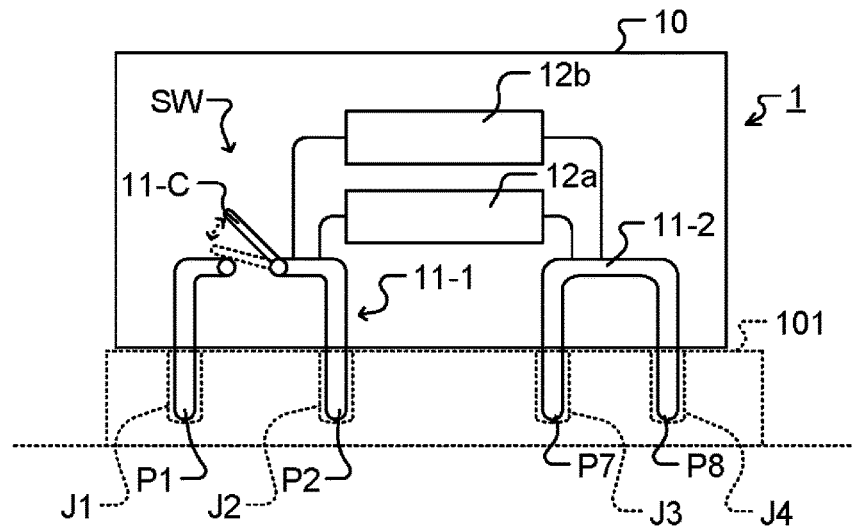
FIG. 14 is a view illustrating a connection configuration of a connector cover according to a first modified example of the second embodiment.
Figure 15:
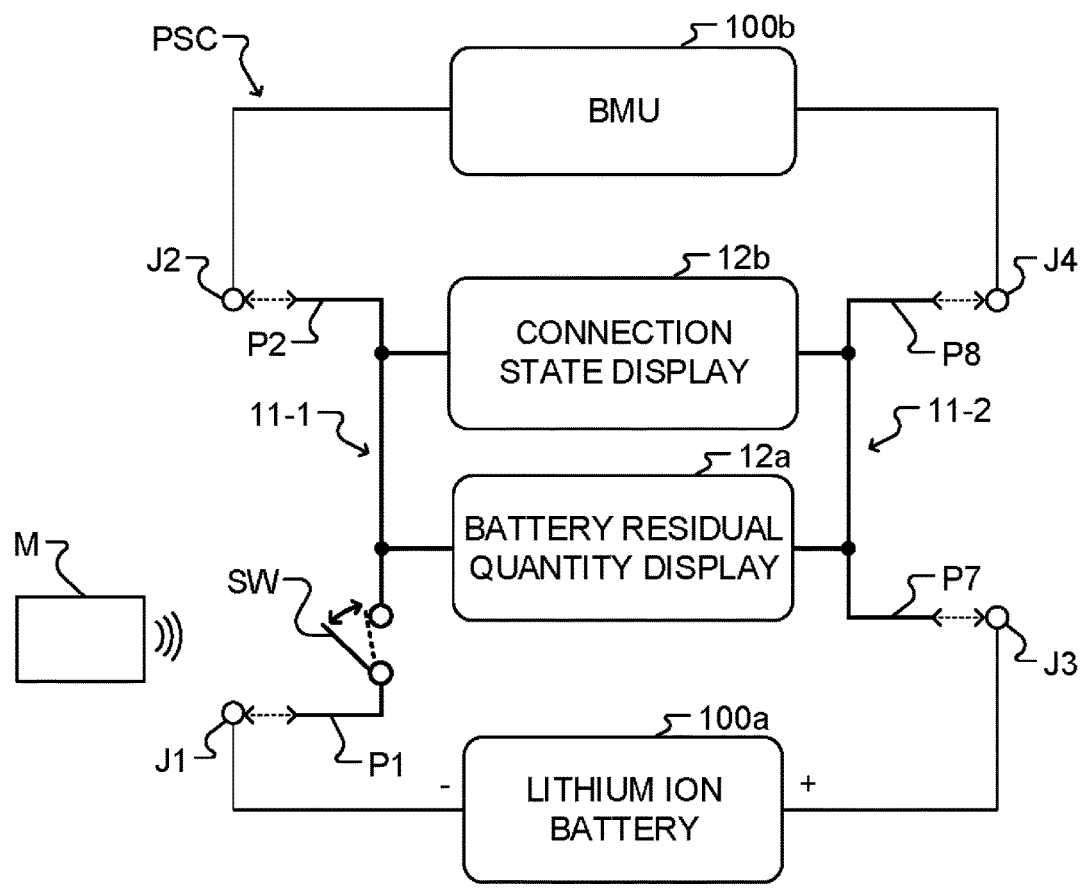
FIG. 15 is a view illustrating a circuit configuration of the connector cover illustrated in FIG. 14 and the secondary battery device.

In addition, as illustrated in FIGS. 14 and 15, the housing portion 10 may be configured to include a pair of pin terminal portion 11-1 and pin terminal portion 11-2, the battery residual quantity display 12a, and the connection state display 12b In this case, the battery residual quantity display 12a and the connection state display 12b are connected in parallel to the pin terminal portion 11-1 and the pin terminal portion 11-2, respectively. In addition, in this case, the switch SW may be provided on any one of the pair of pin terminal portions 11-1 and 11-2.

Figure 16:
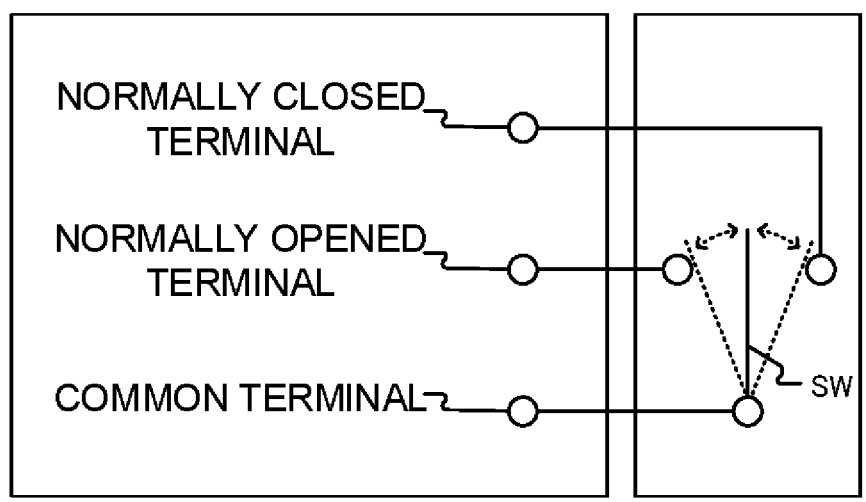
FIG. 16 is a view illustrating a connection configuration of a connector cover according to a second modified example of the second embodiment.

It should be noted that the switch SW of the first and second embodiments and the modified examples are described as a normal open type switch. However, as illustrated in FIG. 16, the switch SW may also be a transfer contact type which switches a connection between a normally opened terminal and a normally closed terminal. In this case, for example, the normally opened terminal is connected to a ground, the normally closed terminal is connected to the lithium ion battery 100a, and a common terminal is connected to the BMU 100b. The pin terminal portion 11 includes the pin plugs P which are inserted into the normally opened terminal, the normally closed terminal, and the common terminal. The connection state display 12b and the battery residual quantity display 12a may be connected in parallel to the pin plug P connected to the normally closed terminal and the pin plug P connected to the common terminal.

In addition, although the above embodiment describes the example in which the opening and closing of the switch SW are switched by the magnet M, the switch SW may have any configuration as long as the contact may be switched by the contactless operation. For example, the opening and closing of the switch SW may be switched by using communication devices that perform communications such as near field communication (NFC), Wi-Fi (registered trademark), infrared rays, or the like. In this case, for example, the connector cover 1 is supplied with the power of the lithium ion battery 100a, the power of a button type battery, or the like and includes a communicator which performs communication with the communication device. The communicator may be configured to include a function of transmitting the meaning that when the jack terminal J is electrically conducted, the BMU 100b starts by the power supplied from the lithium ion battery 100a or the information (battery residual quantity, connection state, or the like) regarding the state of the lithium ion battery 100a to the communication device. Further, the information may be displayed on the communication device or another device that has received the information. For example, in the case of employing the NFC communication, the switch SW may include an IC chip corresponding to the NFC communication function and a function of switching the opening and closing of an electrode in response to an output of the IC chip. Based on the remote operation by the communication device using the IC card including the NFC chip, the opening and closing of the contacts are switched.

In addition, the connector cover 1 may be configured so that the switch SW of the pin terminal portion 11 is omitted and the pin plug P1 and the pin plug P2 of the pin terminal 11 may be short-circuited by an electric wire. In the modified example, instead of the starting/stopping by the switch SW, the pin plug P1 and the pin plug P2 are inserted into and extracted from the jack terminal J1 and the jack terminal J2, such that the starting and stopping of the BMU 100b are switched by the power of the lithium ion battery 100a. For example, the housing portion 10 in which the pin terminal portion 11, the battery residual quantity display 12a, and the connection state display 12b are hermetically housed is provided so as to be movable in a vertical direction from above the control connector 101. The pin plug P1 and the pin plug P2 of the pin terminal 11 are inserted into the jack terminal J1 and the jack terminal J2 by moving the housing portion 10 downwardly, such that the jack terminal J1 and the jack terminal J2 are electrically conducted to each other. In addition, in this case, the battery residual quantity display 12a and the connection state display 12b are provided to be connected to the lithium ion battery 100a by the insertion of the pin terminal 11, not by the on/off of the switch SW. The state of charge or the connection state of the lithium ion battery 100a is displayed by the power of the lithium ion battery 100a.

In addition, the connector cover 1 may be configured to perform the switching of the conduction and non-conduction of the jack terminal J of the control connector 101 by a combination of the manual operation (direct operation) and the contactless operation of the user. In this case, the jack terminal J may also set any one of both (AND) of the manual operation (direct operation) and the contactless operation of the user and either (OR) of the manual operation (direct operation) or the contactless operation of the user. The electrical conduction and non-conduction between the jack terminal J1 and the jack terminal J2 may be switched by the setting.

Third Embodiment

In addition to at least one secondary battery cell, a secondary battery device in which a battery management system (BMS) for monitoring voltage, temperature, charging and discharging, or the like of the secondary battery cell or a peripheral circuit is built is used.

In such a secondary battery device, the power of the built-in secondary battery cell is consumed by the BMS or the peripheral circuit. As a countermeasure, it is conceivable to adopt a design to be conducted only when a CAN communication connector is connected. Alternatively, when in use in an application not using the CAN communication, it is conceivable to adopt a design to be conducted only when a switch cap simulating the CAN communication is attached to the CAN communication connector. With the design, the power consumption of the secondary battery cell by the BMS or the peripheral circuit may be suppressed.

However, there are cases where an operator mistakes the switch cap simulating the CAN communication for a protective cap at the time of storing the secondary battery device or the like, and connects the switch cap to the secondary battery device. In this case, the secondary battery device has a problem in that overdischarge is caused by the power consumption of the BMS or the peripheral circuit. A switch cap, also referred to as a connector cover, of the third or fourth embodiment suppresses the power consumption simultaneously with simulating the CAN communication when attached to the communication connector.

Figure 17:
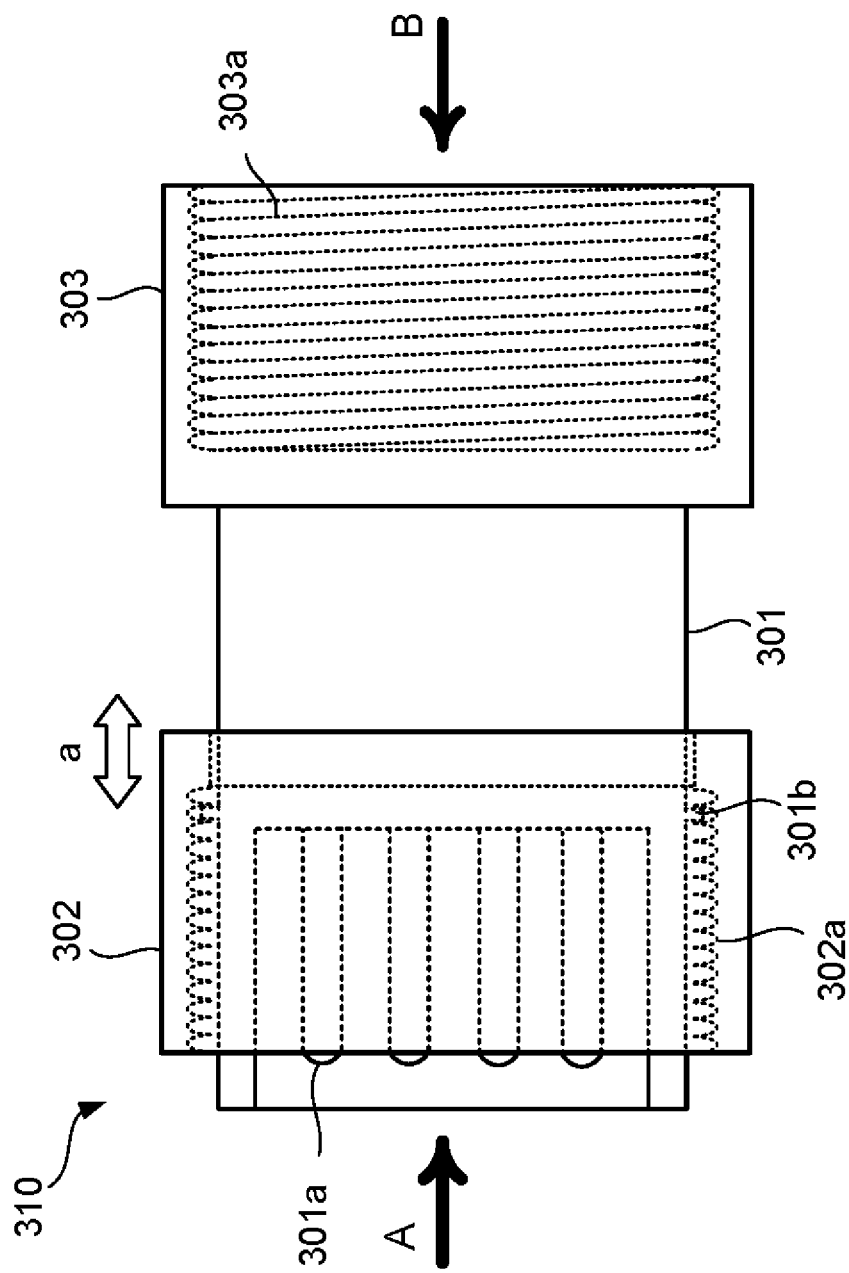
FIG. 17 is a side view illustrating a configuration of a switch cap according to a third embodiment.
Figure 18:
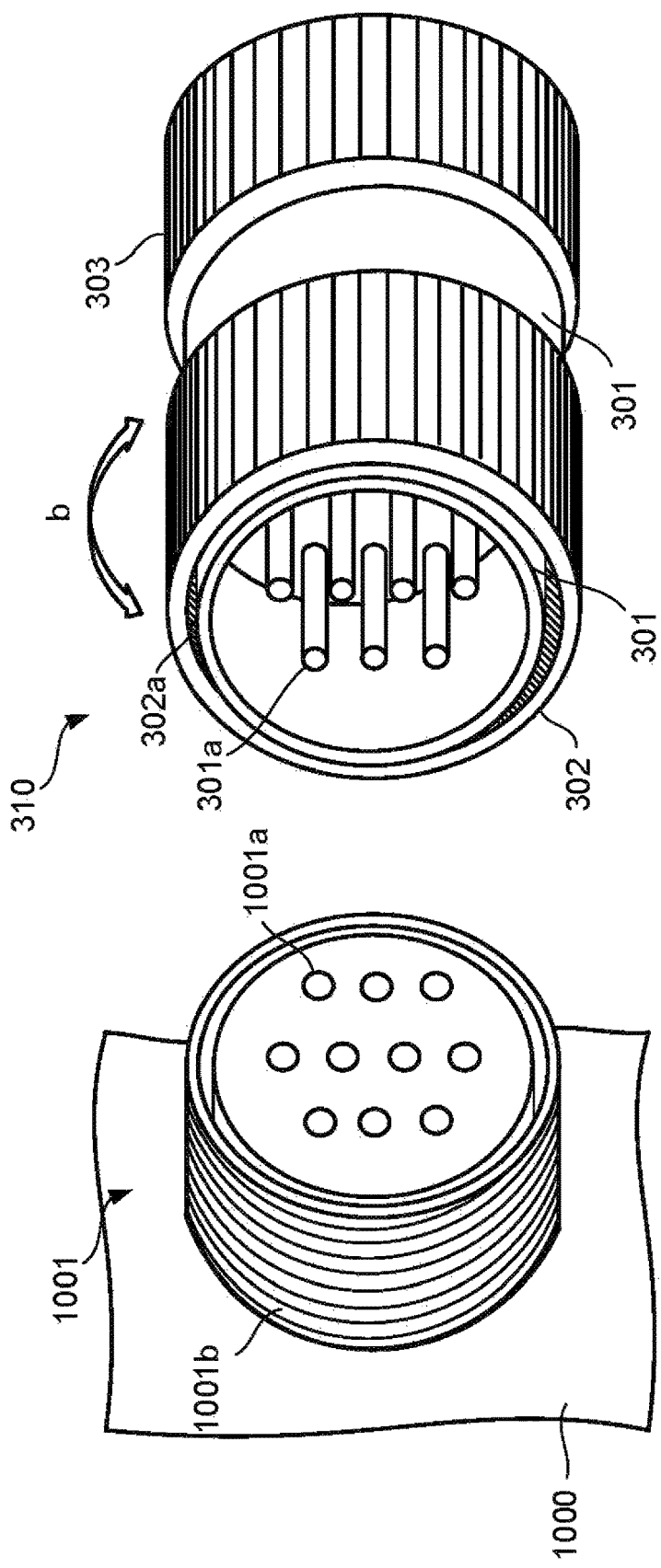
FIG. 18 is a perspective view of the switch cap viewed from direction A in FIG. 17.
Figure 19:
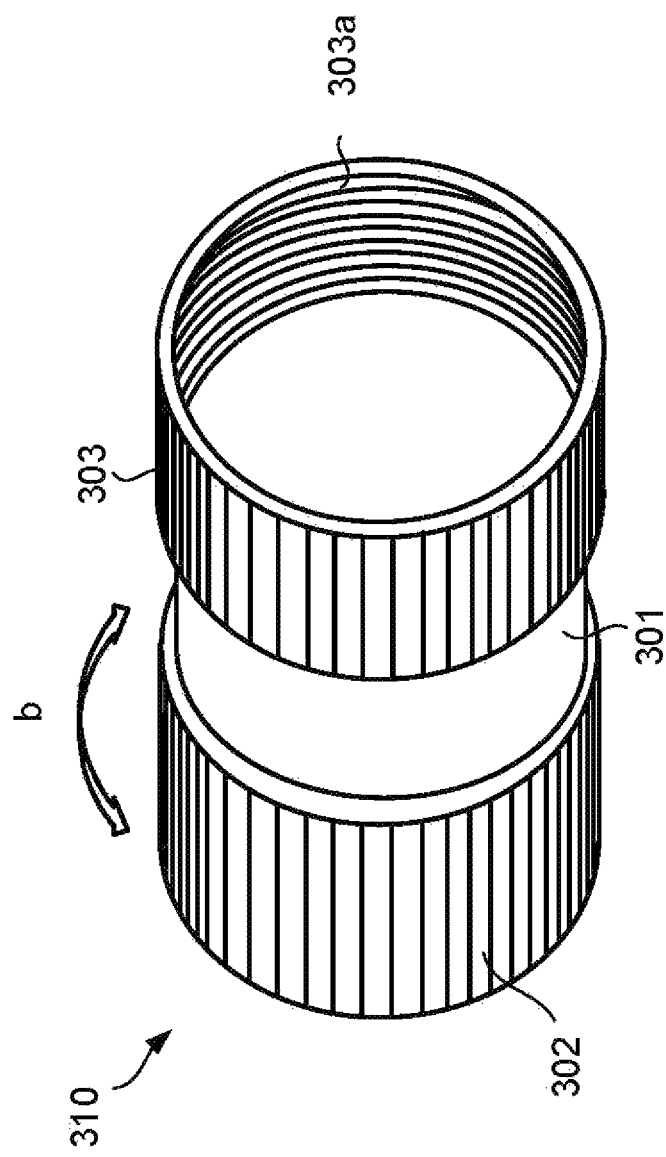
FIG. 19 is a perspective view of the switch cap viewed from direction B in FIG. 17.

FIG. 17 is a side view illustrating a configuration of the switch cap 310 according to the third embodiment. FIG. 18 is a perspective view of the switch cap 310 viewed from direction A of FIG. 17. FIG. 19 is a perspective view of the switch cap 310 viewed from direction B of FIG. 17. It should be noted that FIG. 18 is a perspective view illustrating a CAN communication connector 1001 (also referred to as a control connector) of a secondary battery device 1000 to which the switch cap is attached, in addition to the switch cap according to the third embodiment.

As illustrated in FIG. 17, the switch cap 310 according to the third embodiment includes a plug main body 301, also referred to as a housing portion or a base portion, a disengagement preventing member 302, and a protective member 303. As illustrated in FIG. 18, the plug main body 301 has one end (a side to be attached in case of simulating the CAN communication, i.e., starting side) provided with a plurality of pin terminals 301a, also referred to as pin plugs, which are the connection terminal. The protective member 303 is attached to the other end of the plug main body 301 (a side to be attached in case of not simulating the CAN communication, i.e., a non-starting side). Further, the disengagement preventing member 302 is attached to an outer circumferential surface of the plug main body 301.

As illustrated in FIGS. 27A and 27B, the switch cap 310 is connected to the CAN communication connector 1001 of the secondary battery device 1000. As described later, the secondary battery device 1000 includes a secondary battery cell 1002, a battery management system (BMS) 1003 serving as a controller controlling the secondary battery cell 1002, and a peripheral circuit 1004. The CAN communication connector 1001 includes a plurality of communication connector connecting portions 1001a (for example, jack terminals) into which the plurality of pin terminals 301a are inserted. The CAN communication connector 1001 of the secondary battery device 1000 has the plurality of communication connector connecting portions 1001a. The plurality of communication connector connecting portions 1001a include a pair of connection terminals which is provided on a power supply circuit supplying the power of the secondary battery cell to the BMS 1003 and the peripheral circuit 1004.

For example, as illustrated in FIGS. 17 and 18, the plug main body 301 is formed of a columnar member. The plug main body 301 has a stepped portion 301b provided on the middle thereof. The plug main body 301 includes the plurality of pin terminals 301a, also referred to as pin plugs, having a columnar protrusion structure which is made of aluminum, copper, iron, or the like. The pin terminals 301a are disposed at positions corresponding to each of the communication connector connecting portions 1001a of the CAN communication connector 1001 of the plug main body 301. Among pin terminals 301a, the pin terminals 301a corresponding to the communication connector connecting portions 1001a which are provided on the power supply circuit supplying the power of the secondary battery cell 1002 to the BMS 1003 and the peripheral circuit 1004 are electrically short-circuited to each other by a wiring inside the plug main body 301. For this reason, by putting the pin terminal 301a side of the plug main body 301 in the CAN communication connector 1001, the secondary battery cell 1002, the BMS 1003, and the peripheral circuit 1004 are electrically connected to each other via the pin terminal 301a and the CAN communication connector connecting portion 1001a. In this case, the switch cap 310 conducts (starts) the battery management system (BMS) and the peripheral circuit built in the secondary battery device 100.

As illustrated in FIG. 18, when a direction in which the switch cap 310 is attached to the CAN communication connector 1001 is set to be the starting side in the case of starting the BMS 1003 and the peripheral circuit 1004, the plurality of pin terminals 301a are disposed on the surface of the side to which the plug main body 301 is attached.

In the third embodiment, the plug main body 301 has ten pin terminals 301a. The plug main body 301 of the modified example has 12 and 8 pin terminals 301a or the like without not being limited to 10 pin terminals 301a. Even in this case, it is sufficient that the pairs of pin terminals 301a corresponding to the terminals which are disposed on the circuit supplying the power of the secondary battery cell 1002 to the BMS 1003 and the peripheral circuit 1004 is electrically short-circuited to each other.

As illustrated in FIGS. 17 and 18, the disengagement preventing member 302 is a cylindrical member attached to one end (starting side) of the plug main body 301 in an axial direction. The disengagement preventing member 302 covers the surface on which the pin terminals 301a of the plug main body 301 are disposed and extends from the center of the main body toward the side connected to the CAN communication connector connecting portion 1001a. An inner diameter of the disengagement preventing member 302 is substantially the same dimension as an outer diameter of the CAN communication connector 1001. An inner circumferential surface of the disengagement preventing member 302 is provided with a female screw 302a to be screwed with a male screw 1001b formed on an outer circumferential surface of the CAN communication connector 1001.

In addition, a part corresponding to the female screw 302a of the plug main body 301 is provided with a stepped portion 301b. The stepped portion 301b is engaged with the female screw 302a, and prevents the disengagement preventing member 302 from disengaging from the plug main body 301, i.e., fixes the disengagement preventing member 302 to the plug main body 301. In addition, since the stepped portion 301b is fixed by friction with the female screw 302a, the disengagement preventing member 302 can be rotated in the direction of the outer circumferential surface of the plug main body 301 (bidirectional arrow b in FIG. 18). If the disengagement preventing member 302 is rotated with respect to the plug main body 301, it slides in parallel to the axis center of the plug main body 301 by a spiral structure of the female screw 302a (bidirectional arrow a in FIG. 17).

As illustrated in FIG. 19, the protective member 303 is a columnar member that is attached to the other end (an opposite side of the pin terminal 301a) of the plug main body 301 and shares the axis center with the plug main body 301. In the third embodiment, the protective member 303 has an opening which is open in a direction opposite to the direction in which the pin terminals are connected along the axis center. In the third embodiment, an aperture of the protective member 303 is vertical to the axis center. An inner diameter of the opening is substantially the same dimension as the outer diameter of the CAN communication connector 1001. An inner circumferential surface of the opening is provided with the female screw 303a that is screwed with the male screw 1001b formed on the outer circumferential surface of the CAN communication connector 1001, similarly to the disengagement preventing member 302. In the third embodiment, the protective member 303 is fixed to the plug main body 301. In the switch cap of the modified example, the protective member 303 is attached to the plug main body 301 to be rotatable around the axis center of the plug main body 301.

Figure 20B:
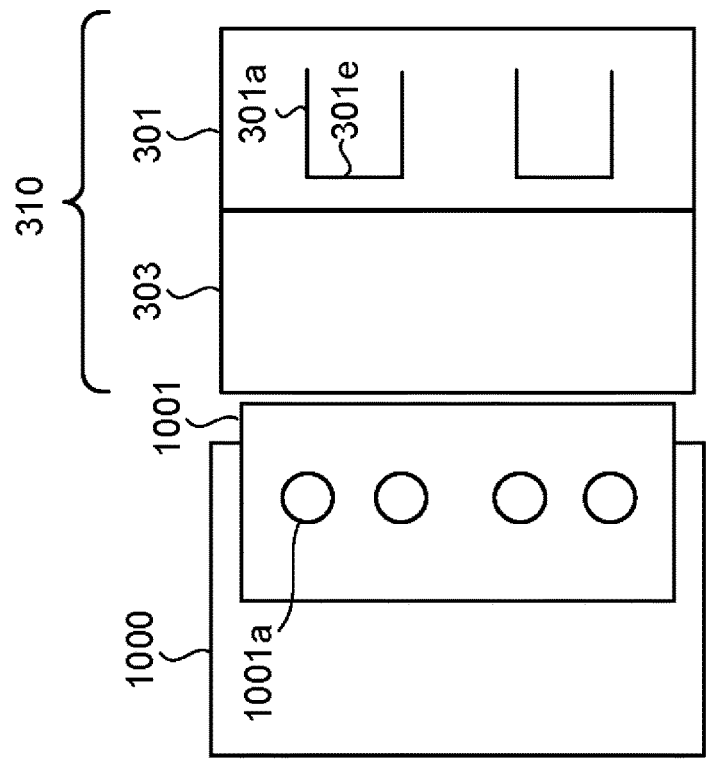
FIG. 20B is a schematic view illustrating a state in which a protective member of the switch cap is attached to the CAN communication connector.
Figure 20A:
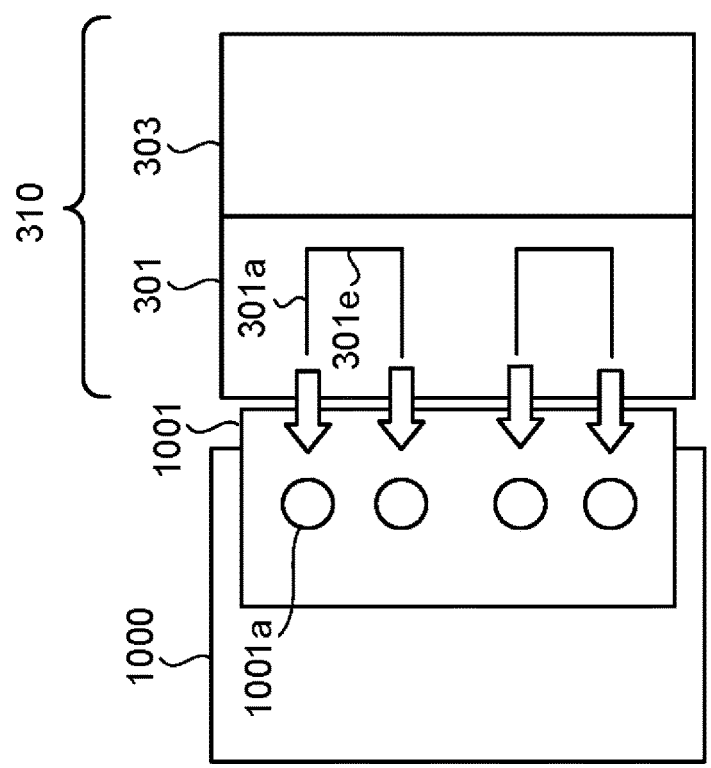
FIG. 20A is a schematic view illustrating a state in which the switch cap is attached to a CAN communication connector.

Next, the operation when the switch cap 310 according to the third embodiment is attached to the CAN communication connector 1001 will be described. FIGS. 20A and 20B are schematic diagrams illustrating a state in which the switch cap according to the third embodiment is attached to the CAN communication connector 1001.

When using the secondary battery device 1000, as illustrated in FIG. 20A, first of all, the operator (user) attaches the plug main body 301 of the switch cap 310 to the CAN communication connector 1001. At this time, the operator aligns the positions of the pin terminal 301a and the communication connector connecting portion 1001a and inserts the pin terminal 301a into the communication connector connecting portion 1001a. Next, the disengagement preventing member 302 is screwed with the female screw 1001a of the CAN communication connector 1001. The plurality of pin terminals 301a electrically connected to each other by a current path 301e (for example, copper line, gold line, or the like) are inserted into the plurality of corresponding communication connector connecting portions 1001a, respectively. As a result, the battery management system (BMS) 1003 and the peripheral circuit 1004 in the secondary battery device 1000 are in a started state (conducted state) by the power of the secondary battery cell 1002.

On the other hand, when the secondary battery device 1000 is not used, as illustrated in FIG. 20B, the operator screws (attaches the protective member 302) the protective member 303 of the switch cap 310 according to the third embodiment with the male screw of the CAN communication connector 1001. Insulating materials such as rubber, cloth, and sponge are paved on a bottom surface of the protective member 303. In addition, like the pin terminal 301a, the structure of supplying the power of the secondary battery cell 1002 to the BMS 1003 or the peripheral circuit 1004 is not disposed. For this reason, when the protective member 303 is attached to the CAN communication connector 1001, there is no conduction to the battery management system and peripheral circuits in the secondary battery device 1000. Alternatively, a conduction rate is smaller than that when the plurality of pin terminals 301a are connected to the plurality of CAN communication connector connecting portions 1001a. In addition, it is also possible to prevent dust or foreign matters from entering the CAN communication connector connecting portion 1001a. In addition, since the switch cap 310 according to the third embodiment is attached to the CAN communication connector 1001 even in either of the case in which the secondary battery device 1000 (at the time of simulating the CAN communication) is used or the case in which the secondary battery device 1000 is not used, for example, it is possible to prevent the switch cap from being lost.

In addition, in the third embodiment, appearances and colors of the plug main body 301, the disengagement preventing member 302, and the protective member 303 or the disengagement preventing member 302 and the protective member 303 are different from each other. For example, the appearance of the opening of the protective member 303 is machined to be a hexagon, whereas the appearance of the opening on the pin terminal 301a side of the flag main body 301 is machined to be a circle. The plug main body and the disengagement preventing member are painted red and the protective member is painted green. For this reason, the conducted state (on/off) to the battery management system (BMS) 1003 and the peripheral circuit 1004 in the secondary battery device 1000 may be more easily understood.

Fourth Embodiment

Figure 21:
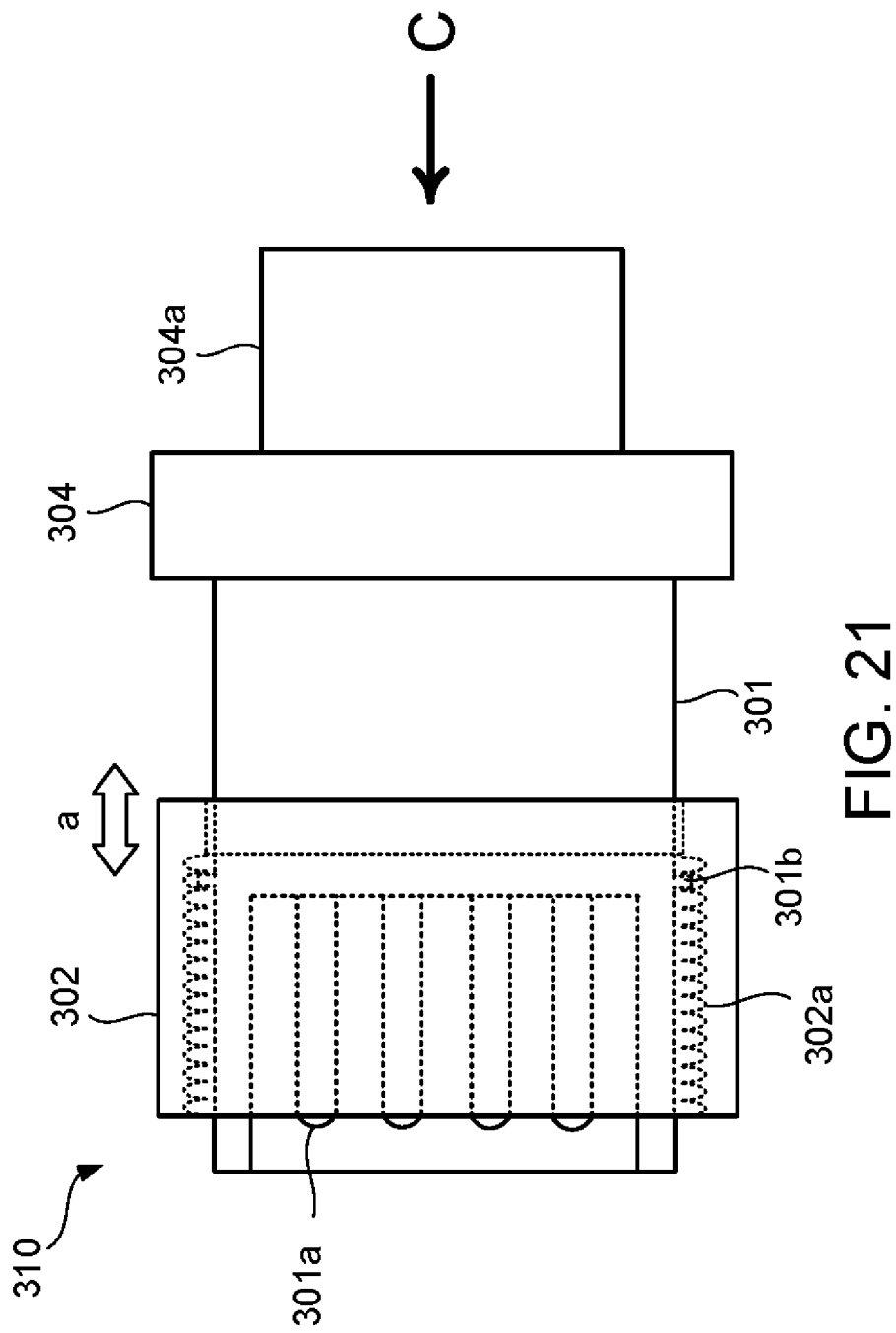
FIG. 21 is a side view illustrating a configuration of a switch cap according to a fourth embodiment.
Figure 22:
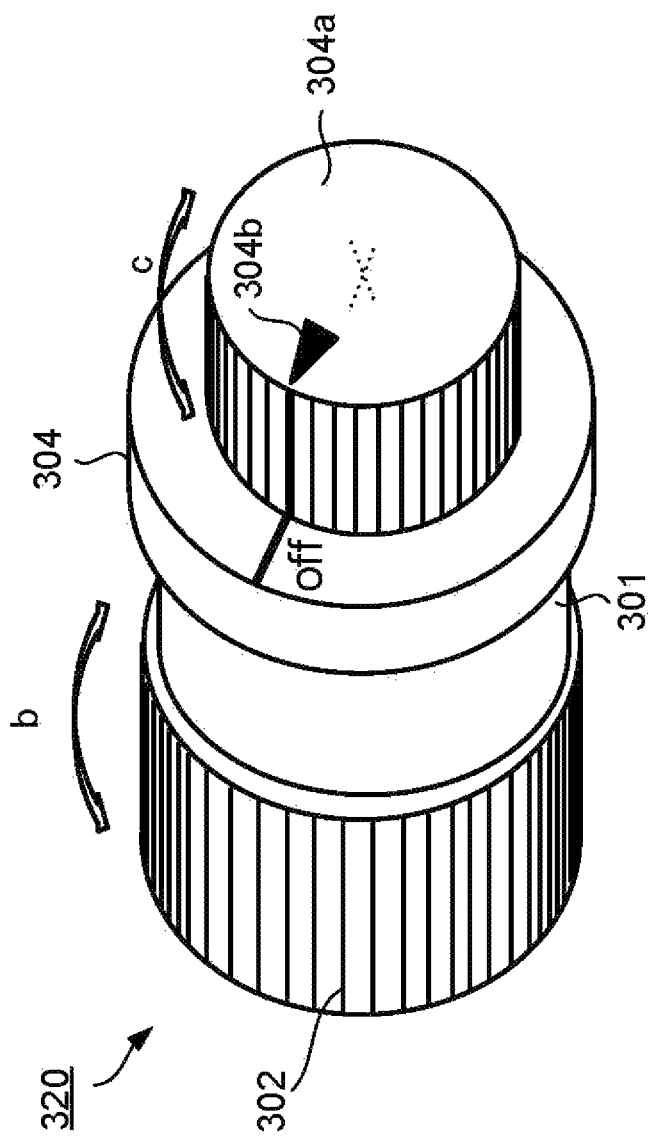
FIG. 22 is a perspective view of the switch cap viewed from direction C in FIG. 21.

FIG. 21 is a side view illustrating a configuration of a switch cap 320 according to a fourth embodiment. FIG. 22 is a perspective view of the switch cap 320 viewed from direction C of FIG. 21. It should be noted that the same components as those of the switch cap 310 according to the third embodiment are denoted by the same reference numerals, and a description thereof will be omitted. Like the switch cap 310, the switch cap 320 is attached to a CAN communication connector 1001 including a communication connector connecting portion 1001a which includes a pair of connection terminals disposed on a supply circuit supplying power of a secondary battery cell 1002 to a BMS 1003 and a peripheral circuit 1004.

As illustrated in FIGS. 21 and 22, the switch cap 320 according to the fourth embodiment includes a plug main body 301, a disengagement preventing member 302, and a protective member 303. A surface of one end (starting side) of the plug main body 301 is provided with a plurality of pin terminals 301a. The disengagement preventing member 302 are attached to an outer circumferential surface of the plug main body 301. In the fourth embodiment, in the plug main body 301 an opposite side (the other end) to the end on which the plurality of pin terminals 301a are disposed is provided with a switcher 304.

In the fourth embodiment, the switcher 304 is a rotary type switch including a knob portion 304a and a conductor 302e. As illustrated in FIG. 22, the knob portion 304a is a columnar member. The knob portion 304a rotates by a predetermined angle around the axis center of the plug main body 301 (bidirectional arrow c in FIG. 22). A triangular mark 304b serving as a mark indicating the current rotational position is displayed on the knob portion 304a. Wirings extending from the pairs of pin terminals 301a corresponding to the pair of communication connector connecting portions 1001a disposed on the power supply circuit supplying the power of the secondary battery cell 1002 to the BMS 1003 and the peripheral circuit 1004 are connected to the switcher 304. When an administrator rotates the knob portion 304a of the switcher 304 by a predetermined angle, wirings extending from pin terminals 301a and the conductor 302e are electrically connected, and the connection state of the pair of pin terminals 301a is switched between the contact state (ON) and the contactless (OFF) state (FIGS. 23B and 23D).

Next, the operation when the switch cap 320 according to the fourth embodiment is attached to the CAN communication connector 1001 will be described. FIGS. 23A to 23D are schematic diagrams illustrating the state in which the switch cap according to the fourth embodiment is attached to the CAN communication connector 1001.

When not using the secondary battery device 1000, first of all, the operator connects the switch cap 320 in the off state (FIG. 23A) to the CAN communication connector 1001. In this case, the operator confirms that the triangular mark 304b of the knob portion 304a points out an off state, and then inserts the pin terminal 301a of the plug main body 301 into the CAN communication connector 1001. Next, the disengagement preventing member 302 is screwed with the male screw 1001b of the CAN communication connector 1001.

Figure 23A:
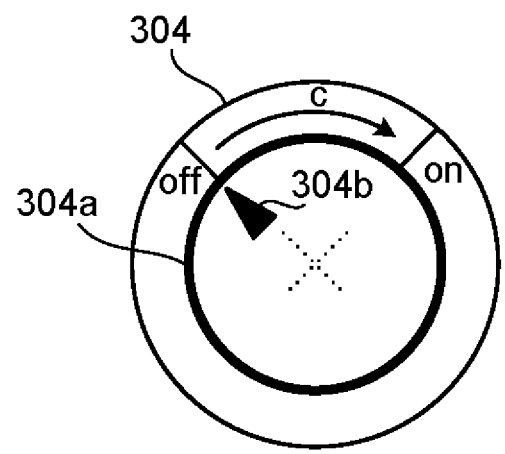
FIG. 23A is a top view of the switch cap in the switch off state.
Figure 23B:
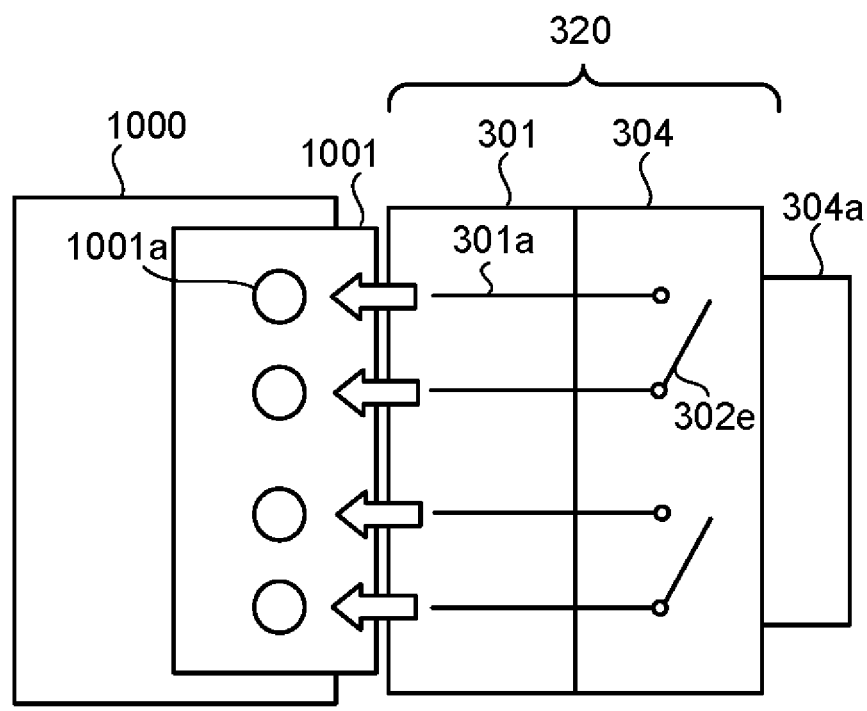
FIG. 23B is a schematic view illustrating a state in which the switch cap in the switch off state is attached to the CAN communication connector.
Figure 23C:
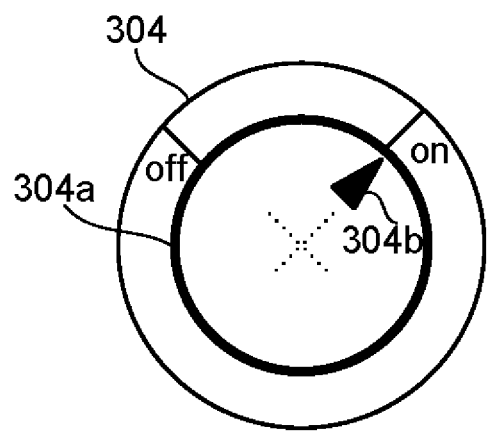
FIG. 23C is a top view of the switch cap in the switch on state.
Figure 23D:
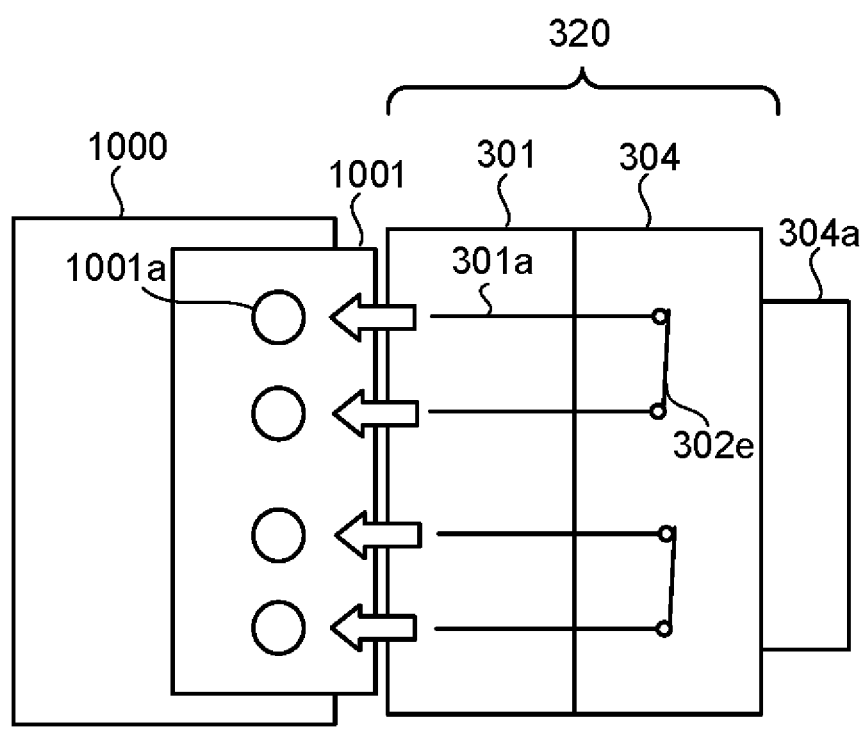
FIG. 23D is a schematic view illustrating a state in which the switch cap in the switch on state is attached to the CAN communication connector.

In this state, as illustrated in FIG. 23B, the electrical connection between the pair of pin terminals 301a is in the off state, and the battery management system (BMS) 1003 and the peripheral circuit 1004 in the secondary battery device 1000 are not conducted (the power of the secondary battery cell 1002 is not supplied).

On the other hand, when using the secondary battery device 1000 (simulating the CAN communication), the administrator rotates the knob portion 304a of the switcher 304 clockwise (middle arrow c in FIG. 22). In this case, the triangular mark 304b moves from the position in the off state to the position in the on state (see FIGS. 23C and 23D). In this state, as illustrated in FIG. 23D, the pairs of pin terminal 301a corresponding to the pairs of communication connector connecting portions 1001a provided on the power supply circuit supplying the power of the secondary battery cell 1002 to the BMS 1003 and the peripheral circuit 1004 are electrically connected to each other. For this reason, the battery management system (BMS) 1003 and the peripheral circuit 1004 in the secondary battery device 1000 are in the started (conducted) state.

Figure 24:
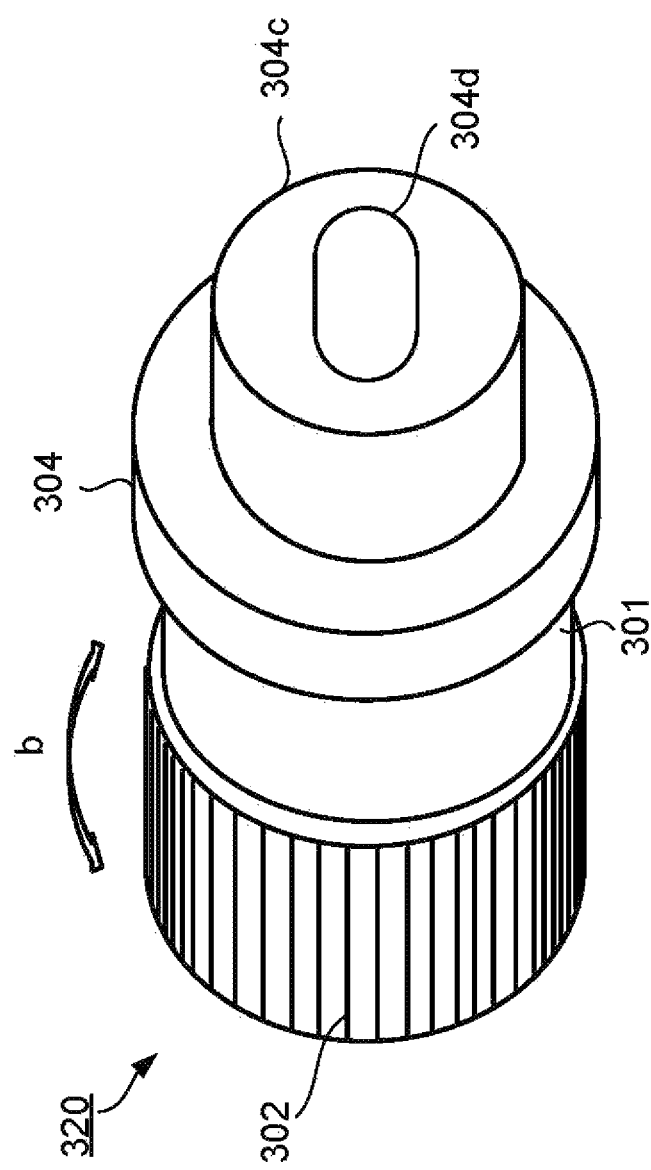
FIG. 24 is a perspective view illustrating a switch cap according to a modified example of the fourth embodiment.

In addition, the switcher 304 of the switch cap 320 according to the fourth embodiment may also be replaced by another type from the rotary type switch. FIG. 24 is a perspective view illustrating a switch cap 320 according to a modified example of the fourth embodiment. It should be noted that the same components as those of the switch cap 320 according to the fourth embodiment are denoted by the same reference numerals, and a description thereof will be omitted.

As illustrated in FIG. 24, in the modified example of the switch cap 320 according to the fourth embodiment, the switcher 304 is changed from the rotary type to a push button type switch. The switch cap 320 of the modified example is provided with a pressing portion 304c in place of the knob portion 304a as the switcher 304. The pressing portion 304c is formed of, for example, a columnar member. The pressing portion 304c is attached to the plug main body 301 to be movable in the axial direction of the plug main body 301. The pressing portion 304c is urged in a direction (reverse direction to a starting direction) away from the center of the plug main body 301 along the axis center by an elastic member such as a spring. The inside of the pressing portion 304c is provided with a conductor 304e (illustrated in FIGS. 25B and 25D) which electrically connects the pairs of pin terminals 301a corresponding to the pairs of CAN communication connector connecting portions 1001a disposed on the power supply circuit supplying the power from the secondary battery device 1000 to the battery management system (BMS) 1003 and the peripheral circuit 1004.

In addition, the pressing portion 304c includes a display 304d. The display 304d includes a light emitting body such as an LED or a light bulb that emits light with the power supplied to the conductor 304e. For this reason, when wirings connected to the pair of pin terminals 301a contact the conductors 304e (FIG. 25D), for example, characters such as 'ON' or symbols are lit up (see FIG. 25C).

Next, the operation when the switch cap 320 according to the modified example of the fourth embodiment is attached to the CAN communication connector 1001 will be described. FIGS. 25A to 25D are schematic diagrams illustrating the state in which the switch cap 320 according to the modified example of the fourth embodiment is attached to the CAN communication connector 1001.

First of all, the operator attaches the switch cap 320 in the off state to the CAN communication connector 1001. In this case, the operator confirms that the pressing portion 304c of the switcher 304 is not pushed into the plug main body 301 side. The pin terminal 301a of the plug main body 301 is inserted into the communication connector connecting portion 1001a of the CAN communication connector 1001. Next, the disengagement preventing member 302 is screwed with the male screw 1001b of the CAN communication connector 1001.

Figure 25A:
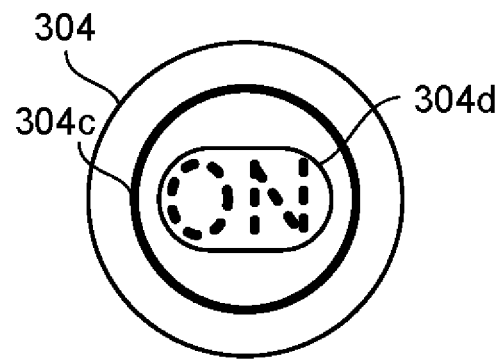
FIG. 25A is a top view of the switch cap in the switch off state.
Figure 25B:
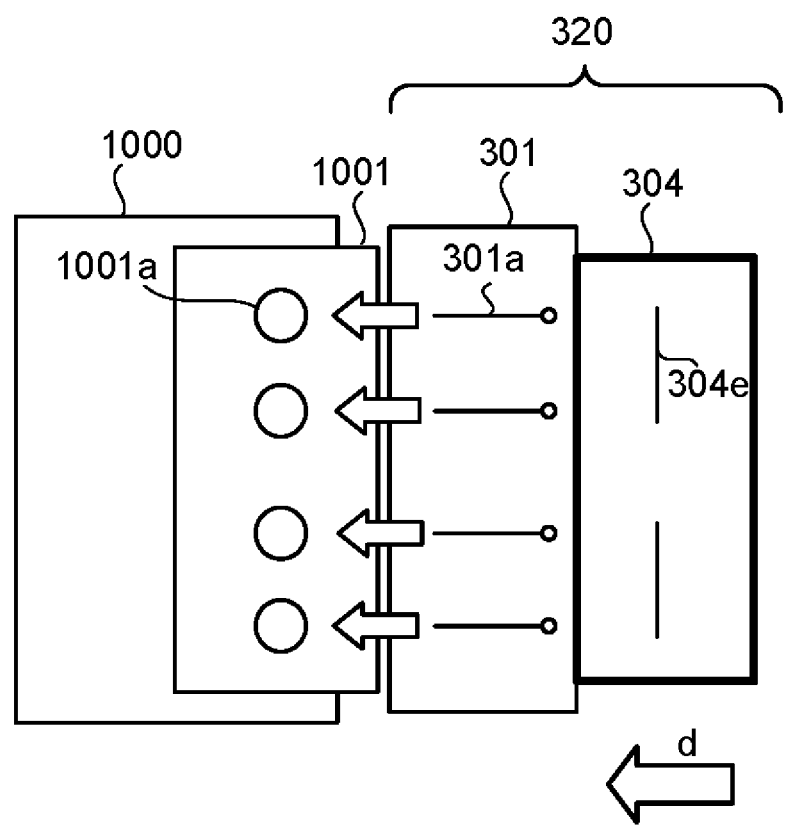
FIG. 25B is a schematic view illustrating the state in which the switch cap in the switch off state is attached to the CAN communication connector.
Figure 25C:
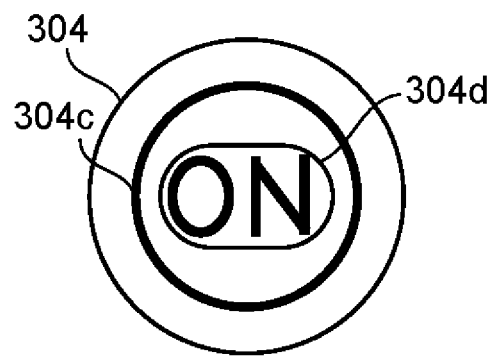
FIG. 25C is a top view of the switch cap in the switch on state.

In this state, as illustrated in FIG. 25B, the battery management system 1003 and the peripheral circuit 1004 in the secondary battery device are not conducted. As a result, the display 304d is not lit up (see FIG. 25A). On the other hand, when using the secondary battery device 1000 (when simulating the CAN communication), the operator pushes the pressing portion 304c into the plug main body 301 side (the direction of arrow d in FIG. 25B). By doing so, the switcher 304 switches from the off state to the on state. Specifically, the wirings which extend from the pair of pin terminals 301a connected to the pair of CAN communication connector connecting portions 1001a disposed on the power supply circuit from the secondary battery device 1000 to the BMS 1003 and the peripheral circuit 1004 are electrically connected to the conductors 304e (see FIG. 25D). As a result, an electricity supply path from the secondary battery cell to the BMS 1003 and the peripheral circuit 1004 is connected, and the BMS 1003 and the peripheral circuit 1004 in the secondary battery device 1000 are in the conducted state.

Figure 25D:
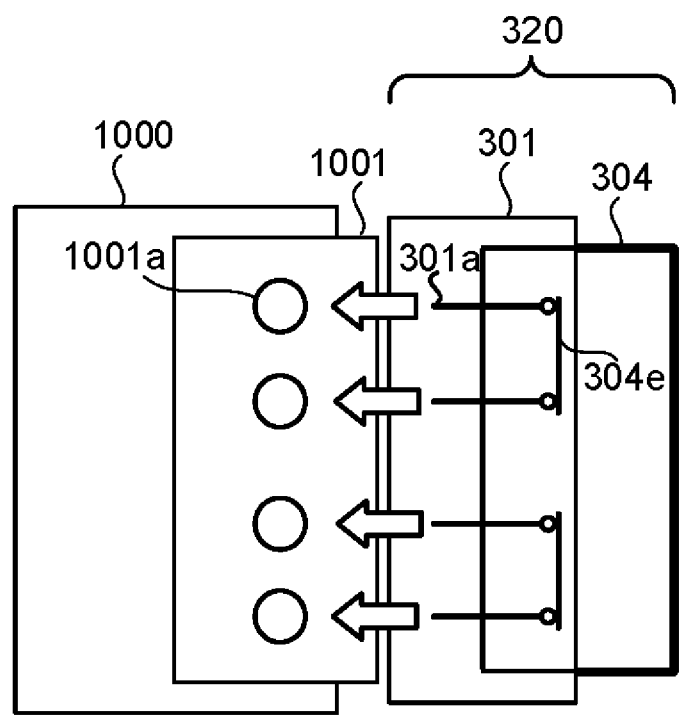
FIG. 25D is a schematic view illustrating the state in which the switch cap in the switch on state is attached to the CAN communication connector.

From the state of FIG. 25D, the operator pushes the pressing portion 304c again, and thus the pressing portion 304c is urged by the elastic body to move to the position of FIG. 25B. As a result, the wirings of the pair of pin terminals 301a do not electrically contact the conductors 304e. As a result, the BMS 1003 and the peripheral circuit 1004 stop (the conduction is released). When the battery management system (BMS) and the peripheral circuit are conducted, the light emitting body of the display 304d is lit up, whereas when the battery management system (BMS) and the peripheral circuit are not conducted, the light emitting body of the display 304d is not lit up. For this reason, the operator can know the conducted state (on/off) as to whether or not the power of the secondary battery cell 1002 is supplied to the battery management system (BMS) 1003 and the peripheral circuit 1004 in the secondary battery device 1000 when the switch cap 320 is attached.

Figure 26:
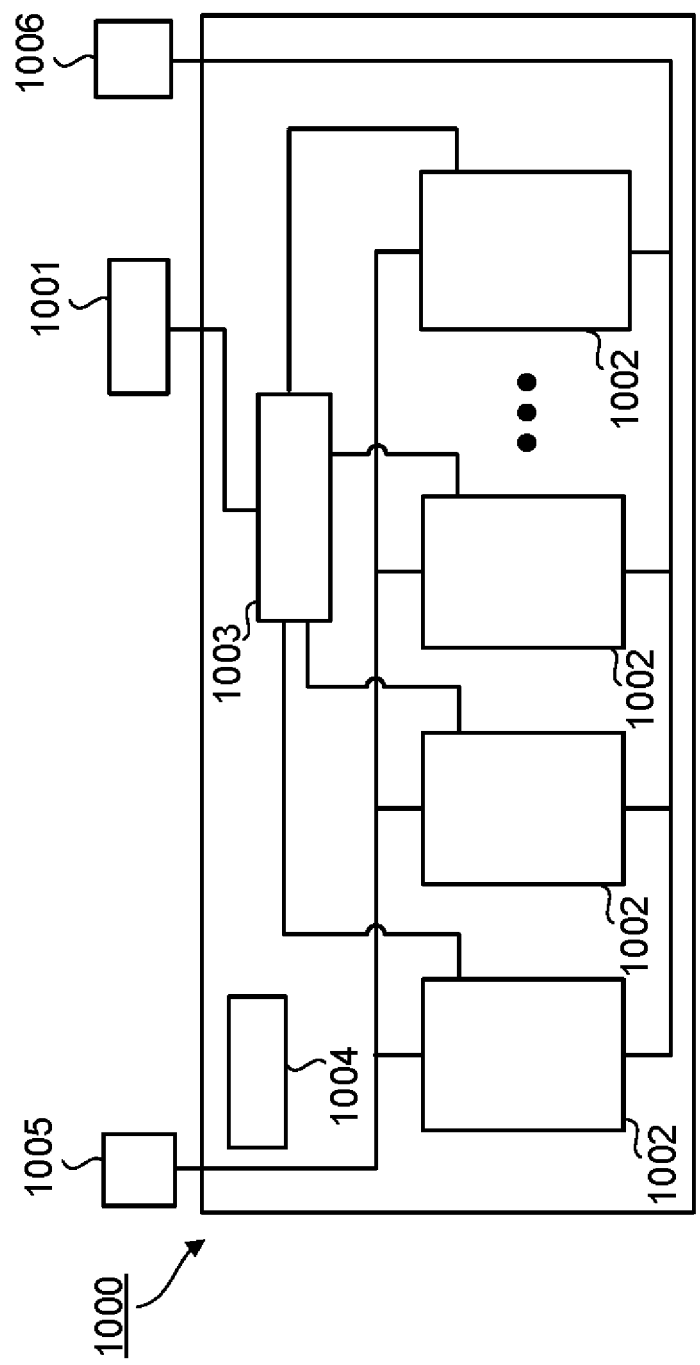
FIG. 26 is a block diagram illustrating a schematic configuration of the secondary battery device according to the third and fourth embodiments.

Next, a description will be given of a secondary battery device 1000 (also referred to as a power supply device) to which the switch cap 310 (or the switch cap 320) according to the third and fourth embodiments and their modified examples is applied. FIG. 26 is a block diagram illustrating an example of a schematic configuration of the secondary battery device 1000 to which the switch cap 310 is applied. FIG. 27A is a view illustrating an appearance of the secondary battery device 1000 of FIG. 26. FIG. 27B is a view illustrating the secondary battery device 1000 to which the switch cap 310 according to the third embodiment is attached. It should be noted that the same goes for the switch cap 320 according to the fourth embodiment.

As illustrated in FIG. 26, the secondary battery device 1000 includes a CAN communication connector 1001 which outputs information to an host device, a plurality of secondary battery cells 1002 connected to each other in parallel, a battery management system (BMS) 1003, a peripheral circuit 1004 such as a current measuring device, a positive electrode external terminal 1005, and a negative electrode external terminal 1006. As the secondary battery cell 1002, for example, a lithium ion type storage battery is used. In the fourth embodiment, although the plurality of secondary battery cells 1002 are connected to each other in parallel, they may be connected to each other in series. In addition, the number of secondary battery cells 1002 is not particularly limited and may be one or more.

The BMS 1003 includes a voltage temperature monitor unit (VTM) which measures the voltage and temperature of the secondary battery cell 1002, and a battery management unit (BMU) which controls charging and discharging of the secondary battery cell 1002. The voltage temperature monitor unit includes a voltage sensor which measures a voltage of each secondary battery cell 1002 and a thermistor which measures temperature of each secondary battery cell 1002. The voltage temperature monitor unit transmits the measured voltage and temperature data of each secondary battery cell 1002 to the battery management unit (upper control device).

The battery management unit specifies the state of charge (SOC) using the voltage and temperature data received from the battery monitor unit and the discharge current or charging current of the secondary battery cell 1002 received from the current measuring device. In addition, the battery management unit outputs information of the specified state of charge to the upper control device or the like using a communication means such as CAN communication.

As illustrated in FIG. 27A, the appearance of the secondary battery device 1000 has substantially a cubic shape. An upper surface of the secondary battery device 1000 is provided with the CAN communication connector 1001, the positive electrode external terminal 1005, and the negative electrode external terminal 1006. In addition, a knob portion 1007 is provided at positions opposite to each other on both side surfaces. A CAN communication cable or the switch cap simulating the CAN communication like the switch cap 310 according to the third embodiment as illustrated in FIG. 27B is attached to the CAN communication connector 1001, such that the conduction to the BMS 1003 and the peripheral circuit 1004 in the secondary battery device is performed.

In the third and fourth embodiments and their modified examples, the secondary battery device 1000 includes a battery management system (BMS) 1003 and a peripheral circuit 1004 such as a current measurement device. If the switch cap is attached to the CAN communication connector in the on state, the power of the secondary battery cell was supplied to the BMS and the peripheral circuit 1004. However, the present invention is not limited thereto, and even if the secondary battery device 1000 may be configured to include any of the battery management system (BMS) 1003 or the peripheral circuit 1004 as a circuit which consumes power when the switch cap is attached, the effect can be achieved.

In addition, the connector cover of the first or second embodiment may be applied to the secondary battery device 1000. Alternatively, even when the switch cap of the third or fourth embodiment may be used for the secondary battery device 100 described in the first and second embodiments, the effect can be achieved.

Here, the connector cover or the switch cap described in each embodiment and its modified example is configured to serve as a mark indicating the information as to whether the pairs of connection terminals (jack terminal J1, jack terminal J2 or the like) provided on the power supply circuit suppling power to the management unit of the secondary battery are electrically connected to each other. For example, only when the pin plug P of the pin terminal portion 11 is connected to the jack terminal J and the switch SW is in the on state, the battery residual quantity display 12a included in the connector cover 1 of the first and second embodiments displays the battery residual quantity. In contrast, when the switch SW is in the off state (when the pin plug P1 and the pin plug P2 are not in contact with each other), the battery residual quantity is not displayed. That is, the battery residual quantity display 12a indicates that the jack terminal J1 and the jack terminal J2, which are each connected to the pair of connection terminals on the supply circuit, are electrically connected to each other.

The connection state display 12b also displays that the battery is connected by lighting when the pin plug P1 and the pin plug P2 of the pin terminal portion 11 are connected to the jack terminal J1 and the jack terminal J2 and the switch SW is in the on state. For this reason, even the connection state display 12b also indicates that the jack terminal J1 and the jack terminal J2 which are each connected to the pair of connection terminals on the supply circuit are electrically connected to each other.

In addition, in the switch cap 310 of the third embodiment, if the switch cap 310 having the plug main body 301 on the starting side (side of the pin terminal 301a) is attached to the CAN communication connector 1001, the protective member 303 is positioned on the opposite side (upper surface in FIGS. 17 to 20B) of the secondary battery device. For this reason, the administrator can easily view the protective member 303. In contrast, if the protective member 303 is attached to the CAN communication connector 1001, the pin terminal 301a and the disengagement preventing member 302 are positioned on the opposite side of the secondary battery device 1000. In this case, the administrator can allow the user to easily view the pin terminal 301a and the disengagement preventing member 302. Depending on the presence or absence of the pin terminal 301a, the administrator can distinguish on which side the switch cap 310 is connected to the CAN communication connector 1001, such that the user can identify whether the plurality of connection terminals on the supply circuit are electrically connected to each other.

In addition, even when the switch cap 320 of the fourth embodiment is attached to the CAN communication connector 1001, if the triangular mark 304b of the knob portion 304a is in the on position (FIG. 23C), it can be identified that the plurality of CAN communication connector connecting portions 1001a disposed on the power supply circuit are electrically connected to each other. In contrast, if the triangular mark 304b is in the off position (FIG. 23A), even when the switch cap 320 is attached to the CAN communication connector 1001, it can be identified that the plurality of CAN communication connector connecting portions 1001a disposed on the power supply circuit are electrically disconnected from each other. Similarly, the same goes for the modified examples illustrated in FIGS. 25A and 25C.

Even in any configuration, even if the switch cap simulating the CAN communication is attached to the management connector, it is possible to identify the information on whether the plurality of terminals on the connector side disposed on a distribution circuit which supplies power from the secondary battery to the battery management system (BMS) 1003 and the peripheral circuit 1004 are connected to each other. For this reason, it is possible to suppress the unintended power consumption of the secondary battery.

In the above embodiments and their modified examples, the connector cover or the switch cap is attached to a circular connector. The shape of the connector is not limited to a circle, and the connector may have other known shapes such as a de-subminiature or a modular jack as long as it can stably connect between the plurality of terminals. In addition, with the shape of the connector being circular, a notch is provided in the connector and at the same time a convex structure is provided at a corresponding position of the connector cover, such that the correspondence relationship between the pin plug and a socket may be physically restricted. When the shape of the connector is changed from a columnar shape in the switch cap having the protective member, the shape of the protective member may have a shape corresponding to the connector.

In addition, in the above embodiment, an example of the switch or the switcher may include the rotary switch or the press button, but other known switches such as a switch using a metal-oxide-semiconductor field-effect transistor (MOS-FET) element may be used. Even when any switch is adopted, when the connection terminal on the cover side is connected to the terminal on the connector side in the switch on state, the conductive portion included in the switch electrically connects between the plurality of terminals of the connector side disposed on the power distribution circuit.

In addition, the functions and structures described in the first to fourth embodiments can be arbitrarily applied to other embodiments within a range in which the functions are not disturbed. For example, the structure included in the first and second embodiments and their modified examples of which the description is omitted in the switch cap 310 and the switch cap 320 of the third and fourth embodiments may be included in the switch cap. For example, the switch cap 310 or the switch cap 320 may be provided with the waterproof ring 10*d* or the waterproof ring 30*r*. In addition, the switch SW of the first and second embodiments may be provided with the switch cap 310 or the switch cap 320. Alternatively, the connector cover 1 of the first and second embodiments may include the switcher 304 of the third and fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A connector cover attached to a communication connector of a power supply device which includes a secondary battery and a manager managing the secondary battery, the connector cover comprising:
    a plurality of cover side terminals which are each connected to a plurality of connector side terminals, the connector side terminals are connection terminals included in the communication connector and provided on a supply circuit supplying power of the secondary battery to the manager;
    a cover base portion which has a first side on which the plurality of cover side terminals electrically connected by a conductive portion are positioned and a second side different from the first side, and electrically connects between the plurality of connector side terminals on the supply circuit when the plurality of cover side terminals are connected to the connector side terminals; and
    a protector which is positioned on the second side of the cover based portion.

2. The connector cover according to claim 1, wherein the protector has an attaching structure which attaches the protector to the communication connector, and
    when the protector is attached to the communication connector, electrical conductivity between the connector side terminals is lowered than when the cover side terminal is connected to the connector side terminal.

3. The connector cover according to claim 1, further comprising:
    a disengagement preventer which is rotatably attached to an outer circumferential surface of the cover base portion and prevents the cover base portion from disengaging from the communication connector.

4. The connector cover according to claim 3, wherein appearances or colors of the protector and the disengagement preventer are different from each other to be visually recognized.

5. The connector cover according to claim 1, wherein the protector is provided with an opening screwably fastened to the communication connector in an axial direction of the cover base portion.

6. A connector cover attached to a communication connector of a power supply device which includes a secondary battery and a manager managing the secondary battery, the connector cover comprising:
    a plurality of cover side terminals which are each connected to a plurality of connector side terminals, the connector side terminals are connection terminals included in the communication connector and provided on a supply circuit supplying power of the secondary battery to the manager;
    a cover base portion which is provided with the plurality of cover side terminals electrically connected by a conductive portion, and electrically connects between the plurality of connector side terminals on the supply circuit when the plurality of cover side terminals are connected to the connector side terminals; and
    a switcher which switches presence or absence of an electrical connection between the plurality of connector side terminals on the supply circuit.

7. The connector cover according to claim 6, wherein the cover base portion has a first side on which the plurality of cover side terminals are positioned and a second side on an opposite side to the first side, and
    the plurality of cover side terminals are positioned on the first side of the cover base portion and the switcher is positioned on the second side.

8. The connector cover according to claim 6, wherein the switcher is subjected to a pressing operation and switches the presence or absence of the electrical connection between the plurality of connector side terminals on the supply circuit in response to the pressing operation.

9. The connector cover according to claim 6, wherein the switcher is subjected to a rotation operation and switches the presence or absence of the electrical connection between the plurality of connector side terminals on the supply circuit in response to the rotation operation.

10. The connector cover according to claim 6, wherein the switcher is subjected to an operation of a predetermined device existing within a predetermined range from a position of the connector cover and switches the presence or absence of the electrical connection between the plurality of connector side terminals on the supply circuit in response to the operation of the predetermined device.

11. The connector cover according to claim 10, wherein the switcher is a magnet switch, and switches the presence or absence of the electrical connection between the plurality of connector side terminals on the supply circuit in response to a remote operation by a magnet as the predetermined device.

12. The connector cover according to claim 10, wherein the switcher includes a communicator which is operated by the secondary battery, and switches the presence or absence of the electrical connection between the plurality of connector side terminals on the supply circuit in response to a remote operation of a communication device corresponding to the communicator as the predetermined device.

13. A connector cover attached to a communication connector of a power supply device which includes a secondary battery and a manager managing the secondary battery, the connector cover comprising:
   a plurality of cover side terminals which are each connected to a plurality of connector side terminals, the connector side terminals are connection terminals included in the communication connector and provided on a supply circuit supplying power of the secondary battery to the manager;
   a cover base portion which is provided with the plurality of cover side terminals electrically connected by a conductive portion, and electrically connects between the plurality of connector side terminals on the supply circuit when the plurality of cover side terminals are connected to the connector side terminals; and
   an information display which is connected to the plurality of cover side terminals and displays information regarding a state of the secondary battery based on power of the secondary battery.

14. The connector cover according to claim 13, wherein the information display includes a residual quantity display that displays a state of charge of the secondary battery.

15. The connector cover according to claim 13, wherein the information display further includes a state display that displays a connection state of the secondary battery.

16. The connector cover according to claim 13, further comprising:
   a waterproof member which is provided at a part where the communication connector and the cover base portion are engaged with each other, and seals a gap of the engaged part.

17. The connector cover according to claim 13, further comprising:
   a disengagement preventer which is detachably provided on the communication connector and prevents the cover base portion from disengaging from the communication connector.

18. The connector cover according to claim 13, further comprising:
   a switcher which switches presence or absence of an electrical connection between a connection terminal connected to the power supply terminal and a connection terminal connected to the control terminal.

19. The connector cover according to claim 18, wherein the switcher is subjected to at least one of a pressing operation and a rotation operation and switches the presence or absence of the electrical connection between the plurality of connector side terminals on the supply circuit in response to the operation.

20. The connector cover according to claim 18, further comprising:
   a waterproof member which is provided at a part where the switcher and the cover base portion are engaged with each other and seals a gap of a part where the communication connector and the cover base portion are engaged with each other.

* * * * *